(12) United States Patent
Nilsson et al.

(10) Patent No.: US 7,200,493 B2
(45) Date of Patent: Apr. 3, 2007

(54) METHOD FOR SCREENING CRYSTALLIZATION OR AMORPHOUS STAGE CONDITIONS FOR MOLECULES

(75) Inventors: Staffan Nilsson, Lund (SE); Eila Cedergren, Klagstorp (SE); Sabina Santesson, Malmö (SE)

(73) Assignee: Chemical Holovoice AB, Karlskrona (SE)

( * ) Notice: Subject to any disclaimer, the term of this patent is extended or adjusted under 35 U.S.C. 154(b) by 738 days.

(21) Appl. No.: 10/051,231

(22) Filed: Jan. 22, 2002

(65) Prior Publication Data

US 2003/0049642 A1    Mar. 13, 2003

Related U.S. Application Data

(60) Provisional application No. 60/262,420, filed on Jan. 19, 2001.

(51) Int. Cl.
*G01N 33/48* (2006.01)
*G01N 31/00* (2006.01)
*G06G 7/48* (2006.01)
*C12Q 1/00* (2006.01)

(52) U.S. Cl. .............................. 702/19; 702/22; 702/25; 702/27; 702/29; 702/50; 702/54; 435/4; 435/6; 703/11

(58) Field of Classification Search .................... 703/11
See application file for complete search history.

(56) References Cited

U.S. PATENT DOCUMENTS 5,036,944 A  *   8/1991   Danley et al. ................. 181/0.5
5,173,087 A     12/1992   Kroes et al.
5,641,681 A      6/1997   Carter
2004/0033166 A1* 2/2004   Arnowitz et al. .......... 422/82.05

FOREIGN PATENT DOCUMENTS

WO         WO 99/44746 A1     9/1999

OTHER PUBLICATIONS

Schober, A; Gunther, R; Schwienhorst, A; Doring, M; Lindemann, BF "Accurate high-speed liquid handling of very small biolgical samples." Biotechniques. Aug. 1993; 15(2):324-329.*
Schartz, AM; Berglund, KA "The use of Raman spectroscopy for in situ monitoring of lysozyme concentration during crytsallization in a hanging drop" J. Cryst Growth 1999; 203:599-603.*
Ishikawa, Y; Komada,S "Development of Acoustic and Electrostatic Levitators for Containerless Protein Crystallization" Sci. Tech. J. Dec. 1993; 29(4): pp. 330-338.*
Izmailov et al. "Supersaturated electrolyte solutions: Theory and experiment" Physical Review E, Oct. 1995, vol. 52, No. 4, pp. 3923-3935.*
Giege et al., *Prog. Crystal Growth and Charact.*, 30:237, 1995.
*Crystallisation of Nucleic Acids and Proteins*, eds. Ducruix, A., and Giege, R., Oxford University Press 2000, ISBN 19-963679-6.
"Design of Crystallization Experiments and Protocols", Carter, Jr., C. W., pp. 47-71.

US007200493B2

Crystallisation of Nucleic Acids and Proteins, eds. Ducruix, A., and Giege, R., The Practical Approach Series, Oxford University Press, 1992.
"The Biological Macromolecule Crystallization Database: A Tool for Developing Crystallization Strategies" Gilliland, G. L. et al, Methods: A Companion to Methods in Enzymology, vol. 1, No. 1, Aug., pp. 6-11, 1990.
Rhim et al., *J. Cryst. Growth*, 110:293-301, 1991.
Schwartz et al., *J. Cryst. Growth*, 203:599, 1999.
Petersson et al., *J. Chromatogr.*, 714:39, 1998.
Nilsson et al., *Anal. Methods Instr. Special Issue* µ-TAS'96, 96:88, 1996.
*J. Mol. Bio.*, 214:641-642, 1990.
Stura, E.A., Nemerow, G.R., and Wilson, I.A., "Strategies in the Crystallisation of Glycoproteins and Protein Complexes", *Journal of Crystal Growth*, 122:273-285, 1992.
McPherson et al., "A Comparison of Salts for the Crystallization of Macromolecules", *Protein Science*, 10:418-422, 2001.
Petersson, M., Wahlund, K.G., and Nilsson, S., "Miniaturised On-line Solid-Phase Extraction for Enhancement of Concentration Sensitivity in Capillary Electrophoresis", *J. Chromatogr. A.*, 841:249-261, 1999.
Önnerfjord, P., Nilsson, J., Wallman, L., Laurell, T., and MarkoVarga, G., "Picoliter Sample Preparation in MALDI-TOF MS Using a Micromachined Silicon Flow-Through Dispenser", *Anal. Chem*, 70:4755-4760, 1998.
Laurell, T., Wallman, L., and Nilsson, J., "Design and Development of A Silicon Microfabricated Flow-Through Dispenser fro On-Line Picolitre Sample Handling", *Journal of Micromechanics and Microengineering*, 9:369-376, 1999.
Santesson, S., et al., "Airborne Cell Analysis", *Anal. Chem*, 72:3412-3418, 2000.
Gaspar, S. et al., "A Method for the Design and Study of Enzyme Microstructures Formed by Means of a Flow-Through Microdispenser", *Analytical Chemistry*, 73:4254-4261, 2001.
Cedergren-Zeppezauer et al., *Nature*, 355:740, 1992.
Dauter et al., *Acta Cryst.*, D54:735, 1998.
Dauter et al., *J. Mol Biol.*, 285:655, 1999.
Ishikawa, Y., and Komada, S., "Development of Acoustic and Electrostatic Levitators for Containerless Protein Crystallisation", *FUJUTSU Sci Tech J.* 29:330-338, 1993.
Chung, S.K., and Trinh, E.K., "Containerless Protein Crystal Growth in Rotating Levitated Drops", *J. Cryst. Growth*, 194:384-397, 1998.
"Sparse Matrix Sampling: A Screening Method for Crystallisation of Proteins", Jancarik, J., Kim, S.H., *J. Appl. Cryst.*, 24:409-411, 1991.
Garman, E.F., and Mitchell, E.P., *J. Appl. Cryst.*, 29, 584-587, 1996.

* cited by examiner

*Primary Examiner*—John S. Brusca
*Assistant Examiner*—Eric S. DeJong
(74) *Attorney, Agent, or Firm*—Buchanan Ingersoll & Rooney PC

(57) ABSTRACT

A system and a method for screening of nucleation tendency of a molecule, such as a macromolecule, based on acoustic, electrostatic or hybrid acoustic/electrostatic levitation of a droplet for optimizing crystallization conditions for said molecule. This allows for a controlled approach to determination of supersaturation and allows for screening of crystal nucleation conditions within minutes and hours instead of months and years with a minute amount of starting material compared to conventional crystallization methods.

4 Claims, 15 Drawing Sheets

METHOD FOR SCREENING CRYSTALLIZATION OR AMORPHOUS STAGE CONDITIONS FOR MOLECULES

Figure 1:
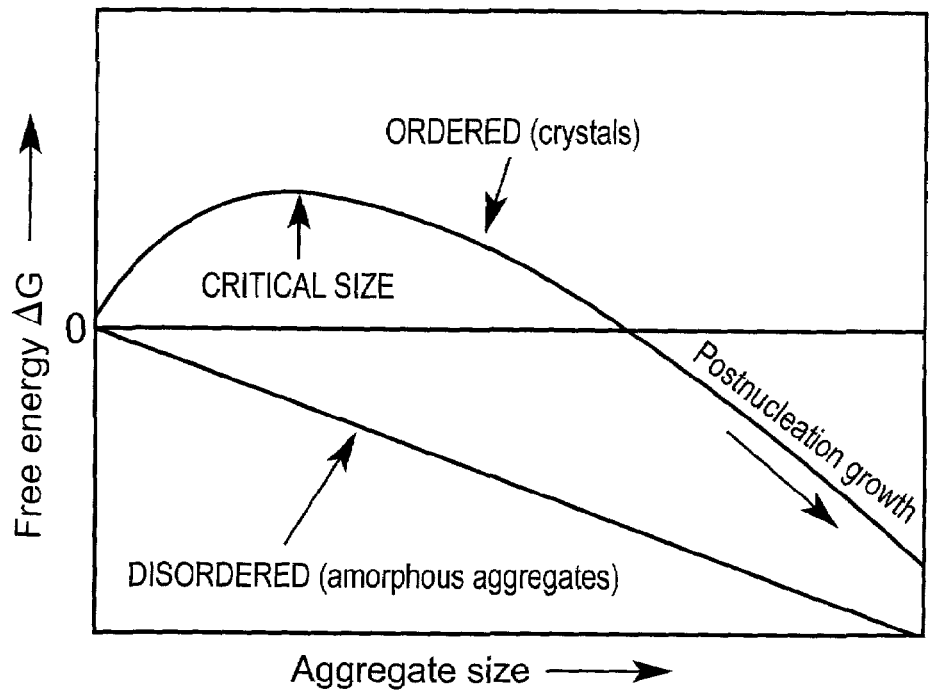

This application claims priority under 35 U.S.C. § 119 to U.S. Provisional Application No. 60/262,420 entitled A SCREENING SYSTEM and filed on Jan. 19, 2001, the entire content of which is incorporated by reference.

TECHNICAL FIELD

The present invention relates to a system and a method for screening nucleation tendency before optimising crystallisation conditions for a molecule in fluid or gas crystal growth and more particularly to a device and a method that identifies nucleation tendency. Also the use of such a system and a method for screening crystal nucleation conditions is contemplated.

BACKGROUND OF THE INVENTION

X-Ray Crystallography and Biocrystallisation

The determination of the three dimensional atomic structure of matter is one of the most important areas of pure and applied research. This field, known as X-ray crystallography, utilizes the diffraction of X-rays from crystals in order to determine the precise arrangement of atoms within the crystal. The result may reveal the atomic structure of substances of different origin such as e.g. metal alloys, salt crystals as well as the structure of proteins and nucleic acid, e.g. deoxy- and ribonucleic acid (DNA and RNA, respectively). Crystallographers have made some of the greatest discoveries in the history of science.

One important and rapidly growing field of crystallography is macromolecular crystallography involving biocrystallization, which is the crystallisation of proteins, nucleic acids and macromolecular assemblies described in Giegé et al. (*Prog. Crystal Growth and Charact.*, 30:237, 1995), Crystalisation of Nucleic Acids and Proteins (editors Ducruix, A., and Giege, R., Oxford University Press, 2000, ISBN 19-963679-6) and in Current approaches to macromolecular crystallisation (McPherson, A., *Eur. J. Biochem.* 189:1–23, 1990). The limiting step in this area of research involves the screening of optimal crystal growth conditions of a particular sample. Like all crystallisation, it is a multiparameter process involving the three classical steps of nucleation, growth and cessation of growth of the crystal. Though, crystallisation of macromolecules differ in a sense compared to growth of smaller molecules due to the much larger number of parameters involved and peculiar physical-chemical properties (table 1). As an example, their optimal stability in an aqueous medium might be restricted to a rather narrow temperature, if the protein is not thermostable, and pH range. But, their main difference from inorganic and organic molecules is the conformational flexibility and chemical versatility of macromolecules and, consequently, their greater sensitivity to external conditions. For a rational strategy in crystallisation, however, the conditions for growth have to be set in a rational way.

Table 1. Parameters Affecting the Nucleation, Crystallisation and/or Solubility of Macromolecules Intrinsic Physico-chemical Parameters
Supersaturation
Fluctuations of temperature and pH
Time and rate of equilibration and growth
Ionic strength and purity of chemicals
Diffusion and convection
Volume and geometry of samples and set-ups
Solid particles wall and interface effects
Density and viscosity effects
Pressure, electric, and magnetic fields
Vibrations and sound Biochemical and Biophysical Parameters
Sensitivity of conformations to physical parameters
Binding of ligands and specific additives
Properties of macromolecules and ageing of samples Biological Parameters
Biological sources
Physiological state of organisms or cells
Bacterial contaminants
Purity of Macromolecules
Macromolecular contaminants
Sequence and conformational heterogeneities
Batch effects Proteins are polymers of amino acids and contain thousands of atoms in each molecule. Considering that there are 20 essential amino acids in nature, one can see that there exists virtually an inexhaustible number of combinations of amino acids to form protein molecules. Inherent in the amino acid sequence or primary structure is the information necessary to predict its three dimensional structure. Unfortunately, science has not yet progressed to the level where this information can be obtained directly from the primary structure. Considerable advances are being made in the area of high field nuclear magnetic resonance. Still, the only method capable of producing a highly accurate three-dimensional structure of a protein is by the application of X-ray crystallography. This requires the growth of reasonably ordered protein crystals (crystals which diffract X-rays to at least 2.0 angstroms resolution or better).

To grow crystals of any dissolved compound the solution containing the molecule(s) have to be brought to a supersaturated state, which is thermodynamically unstable. The solute may develop into a crystalline or amorphous state when it returns to equilibrium. Supersaturation can be achieved by evaporation of the solvent or by abrupt changes in physico-chemical parameters like temperature, pH or pressure. Supersaturation is a prerequisite for formation of crystalline nuclei from which crystals grow. The solubility of a polyelectrolyte (e.g. a protein) is a complex function and it is not trivial to theoretically simulate and thereby predict the conditions for nucleus formation. Therefore, the solubility of a compound is experimentally determined from a solution in equilibrium with crystals.

Because of the complexity of macromolecules, particularly membrane spanning proteins, obtaining suitable crystals can be quite difficult. Macromolecules are extracted from complex biological sources and purification plays an extremely important role in crystallogenesis. Purity must be of "crystallographic grade" meaning that the macromolecule must be correctly folded as well as free of contaminants. Denatured molecules or macromolecules with micro-heterogeneities, such as chemical modifications, negatively affect crystal growth. Typically several hundred to several thousand experiments must be performed to determine crystallisation conditions. Large matrixes exploring pH, buffer type, precipitant type, protein concentration, temperature, etc are examined. This process is extremely time consuming and labour intensive.

The three dimensional structure of a protein determines its function and activity. Knowledge of the structure is therefore imperative in medical and pharmaceutical applications. New and increasing knowledge about the structure of a protein will lead to an increase ability to produce new and relevant drugs. In structural biology, the technical prerequisites to solve complicated structures have dramatically advanced, which makes structural analysis a much faster process than before. In one sector of this multidisciplinary field of research, however, the work is slowed. That is the crystallisation of proteins, protein-ligand complexes or complexes with nucleic acid whose structure or function is to be studied. In pharmaceutical industry, as well as academia, the aim is parallel determination of the genomic sequences and structures of the gene products, but in order to do this the production of crystals must be much faster. Due to the complex and multidimensional character of the crystallisation process, crystallisation of macromolecules has remained a time consuming handcraft that often requires vast amounts of precious and expensive materials.

The resulting three-dimensional structure produced from the protein crystals can have enormous implications in the fundamental understanding of molecular biology such as how enzymes perform various catalytic activities, switch on chemical pathways, or transport molecules within the circulatory system. In the past few years the determination of protein structures important as therapeutic targets has made a rational design possible for new and more efficient pharmaceuticals.

Recent advances in structural biology like syncroton beam sources, fast X-ray detectors, cryotechniques, and high-speed computer graphics has revolutionised the pace at which the three-dimensional structures can be determined. Still, however, the bottleneck has been the determination of conditions necessary to grow high quality protein crystals suitable for X-ray diffraction methods. In order for protein crystals to be suitable for structural analysis via X-ray diffraction methods, crystals in the order of about 0.1–0.2 mm in diameter or greater must be obtained.

Conventional Methods for Crystallization

At present, biologically active macromolecules, such as proteins, are crystallised by a variety of experimental methods. Among these many methods, there are three that are most commonly used in the art (Current approaches to macromolecular crystallisation, McPherson, A., Eur. J. Biochem. 189:1–23, 1990; Crystallisation of nucleic acids and proteins, Edited by A. Ducruix and R. Grieg, The Practical Approach Series, Oxford University Press, 1992; Protein and Nucleic Acids Crystallisation Methods—A companion to Methods in Enzymology, Academic Press, 1:1, August 1990).

In most laboratories, the vapour diffusion method is used. This is a method wherein a drop of a solution containing protein is applied to a glass cover slip or sitting bridge and placed upside down in a sealed chamber, such as a vapor diffusion chamber, where conditions lead to supersaturation in the protein drop and the initiation of precipitation of the protein crystal.

In another method, referred to as the dialysis method, the protein solution is contained within a semipermeable size exclusion membrane and then placed in a solution of appropriate pH, precipitant concentration, etc., as in the reservoir solutions prepared for the vapour diffusion technique. As the precipitant diffuses through the membrane into the protein compartment, the solubility of the protein is reduced and crystals may form. Both vapour diffusion and dialysis methods require extensive screening of numerous variables to achieve the desired results and is, thus, time consuming.

Still another method of protein crystal growth involves what is referred to as gel crystal growth. This method involves the placement of a gel into the end of small diameter glass capillaries. After the solutions have gelled, a protein solution is placed into one end (top) of the capillary and the other end is submerged in a solution of precipitating agent. If the conditions are appropriately selected, crystal growth occurs at a point in the gel where the protein and precipitating agent reach the proper concentrations as the solutions slowly mix by diffusion. Since this is a diffusion-limited process, it thus only occurs after an extended period of time, i.e. precipitation after several hours depending on the size and complexity of the molecule. For larger molecules, such as proteins or complex macromolecular assemblies this approach may be less suitable due to diffusional restrictions. Crystals grown by this method are often larger and of high quality. The approach here used to screen for the proper crystallisation conditions involves the use of numerous bottles of precipitant solutions containing glass capillaries. The method is thus cumbersome and time-consuming. Also, it has the disadvantage of that once the crystals are formed in the gels it is extremely difficult to remove them without damage.

However, the methods described above are usually troublesome, time-consuming and inefficient because current means of employing this technique to achieve crystal growth are somewhat primitive, whether conducted manually or through robotic devices, and involve long series of adjustments of conditions until a suitable experimental regimen is found. In typical screening methods under this process, it is generally required that someone varies the conditions of pH, buffer type, temperature, protein concentration, precipitant type precipitant concentration, etc., for each set of experiments. Still, even after adjusting for the myriad of conditions, most often only minute samples of the protein can be studied at one time. As presently carried out using currently available devices crystal growth methods such as the hanging drop method are tedious, time-consuming, and hard to carry out successfully and efficiently with reproducibility.

Crystal growth in chambers or devices with inner-walls often contributes to the difficulties with producing single and clean crystals. Most often, the crystal then is growing on the wall of the crystal chamber, producing a poly-crystal hard to remove from the wall and subsequently remove a single crystal from without disrupting the structure.

Different means of improving crystallisation conditions including speeding up the initial screening of the specific conditions needed for growing a particular crystal, has been described. In U.S. Pat. No. 5,641,681, a device and method for detecting optimal protein crystallisation conditions in a 1×g or a micro-gravity environment has been described. The method utilises a diffusion-limited process with at least one pair of dialysis chambers housing the crystallisation solutions in which the crystals are grown. Since the diffusion herein is defined by the quantity of gelling substance, it will affect the period of time sufficient to achieve equilibration for the growth of the crystal. The device is useful for screening of crystal growth conditions, and reduces experimental time to about 3–6 months as well as a technical 10-fold reduction in experimental set-ups.

Gravitational phenomena, including convection, sedimentation, and interactions of materials with their containers all affect the crystal growth process. If they are not taken into consideration they can have adverse effects on the quantity and quality of crystals produced. As a practical matter, convection and sedimentation can be completely eliminated only under conditions of low gravity attained during orbital flight. There is, then an advantage of performing crystallisation in space, i.e. below 1 g or at microgravity conditions. As an alternative, conditions for growing crystals under 1 g or in a micro-gravity environment, e.g. space, have been described. One problem during crystal growth, is interaction of materials with containers affecting the crystal growth, as mentioned above. This will lead to crystal growth onto the walls of the container or chamber, wherein the crystallisation experiment takes place, causing quality problems and difficulties when removing them from the walls. U.S. Pat. No. 5,173,087 describes a process for controlling where the nucleation takes place in space by the use of a cooling chamber wherein the crystals are nucleated only at specific locations, i.e. not on the container walls and in controlled numbers only.

Another way of producing an environment below 1 g without performing experiments in space has been described. Different types of levitation systems, e.g. electrostatic or acoustic drop levitators are known and described in e.g. Rhim et al. (J. Chryst. Growth; 110:293, 1991). This allows a containerless method that is clean in two senses. First, the sample is not in physical contact with container or chamber walls that might induce uncontrollable nucleation. Secondly, through software programming of control forces, a sample drop can be isolated from much of the gravity forces as well as oscillatory and impulsive forces known to reside in laboratories, such as e.g. a space laboratory.

Nucleation

Crystallisation aims at establishing a phase separation where a solid phase, e.g. a protein crystal, shall be at equilibrium with a liquid phase. A protein dissolved in buffer must he brought to form a three-dimensional lattice. Practical experience shows that different types of precipitation agents, which change the dielectric constant of the solution, can bring this about. The crystallisation process has three major stages; nucleation, growth and cessation of growth. Crystallisation starts by a nucleation phase, i.e. the formation of the first ordered aggregates, which is followed by a growth phase. Cessation of growth can have several causes. Apart from the obvious ones, like depletion of the macromolecules from the crystallisation medium, it results from growth defects.

The most difficult phase to control in a crystallisation experiment is the nucleation process. The kinetics of nucleation is an exponential function of the degree of supersaturation and a critical value must reach before nuclei can build up. This is when the nucleation point is reached. A critical size of an aggregate is required for a crystal to grow, as seen in FIG. 1. It is an unstable state where physical condition is difficult to measure accurately but forms the basis for crystal nuclei to form.

The standard procedure when set up a crystallisation experiment with an unknown protein is to use commercially available buffer solution that empirically have been shown to work as crystallisation media for other proteins. The number of solutions can be up to 90–100 with different mixtures of precipitation agents at different pH and with additives like salts and polymers. Since a suitable level of protein concentration also needs to be established and different physical parameters, e.g. temperature, needs to be tested, this results in a very large amount of experiments that require huge amounts of sample, i.e. a macromolecule such as a protein. nucleic acid.

Limitations and Future Perspectives

The future perspectives of using small-scale analyses and rapid crystallisation of proteins are enormous in genomics, such as the HUGO (human genome organisation) project, where thousands of gene products will be cloned, expressed and characterised. Attempts to determine the three-dimensional structure of new proteins is part of such a thorough analysis, and protein crystallisation is a necessary step. The protein may further be introduced into single cells in order to study physiological effect(s) and function(s).

Joint efforts by international consortia are made world wide to determine the three dimensional (3D) structures of all proteins eventually identified. This involves research institutions as well as pharmaceutical industry. Protein crystallographers aim at determining high resolution structures in massive numbers at highly efficient synchrotron beam sources, for instance at Stanford (see http://www.jcsg.org/scripts/prod/home.html). This implies that new means and methods are developed meeting the demand for quick prediction of the physical-chemical conditions required for the formation of single crystals of individual proteins or macromolecular complexes used in X-ray experiments. Crystallisation screening kits for proteins as well as nucleic acids are commercially available (Hampton Research, Laguna Niguel, Calif., USA, see www.hamptonresearch.com). Also robots exist, which minimises human intervention in the practical work of setting up large-scale crystallisation trials. However, scientists lack means and methods, which rapidly screen for the crystal nucleation step, a prerequisite for the growth of crystals in the first place.

Problems that have limited the use of high resolution X-ray crystallographic methods in the determination of the three-dimensional structures of macromolecules, e.g. protein molecules is the time-consuming step of determining specific nucleation conditions of a protein. Given the nucleation conditions, a proper crystal may easily be made from the macromolecule. It is thus highly desirable in light of the recent advances in the field of protein crystallography to develop highly efficient, simple, and effective methodologies and means for obtaining the desired conditions for the growth of high quality protein crystals for X-ray crystallography, and yet which can also avoid the problems associated with the prior art methodologies and means, and in this respect, the present invention addresses this need and interest.

SUMMARY OF THE INVENTION

In view of the foregoing disadvantages known in the art when trying to obtain conditions for the growth of high quality protein crystals for e.g. X-ray crystallography within a reasonable time frame i.e. minutes instead of months and years, and without consuming large amount of the desired protein the present invention provides a new and improved system and method for screening for optimal crystallisation conditions in solution.

As such. the principal object of the present invention is to provide a new and improved system and method for screening nucleation tendency, preceding growth of a crystal, of a molecule in a fluid or gas having all the advantages of the prior art and none of the disadvantages.

In support of the principal object, a further object of the present invention is to provide a new and improved system and method for obtaining optimal crystallisation conditions which allows for highly efficient means to screen for optimal macromolecule crystal growth conditions that will rapidly generate crystals of sufficient size and quality for application in X-ray crystallography.

To fulfil these and other objects, the present invention relates to a method for screening nucleation tendency of a molecule in a fluid or gas, where the method comprises levitating at least one droplet of the fluid or gas in an levitator, such as a aucustic levitator, delivering at least one substance to the levitated droplet with a piezoelectric flow-through dispenser for delivering a substance, detecting the nucleation tendency and also scoring the nucleation tendency.

Further on, the invention also refers to a system for screening nucleation tendency comprising at least one levitator, such as acoustic, for positioning at least one droplet, at least one dispenser for delivering at least one substance, such as a precipitating agent, to the positioned droplet, and one or more means for detecting nucleation tendency in the at least one levitated droplet.

Specifically, it is an object of the invention to provide an efficient means of detecting the nucleation tendency using e.g. Raman spectroscopy, a multi-angle light scattering, nephelometry, or an illuminator source and manual visual detection using microscope and a camera, to obtain quantitative measurements of aggregate formation, precipitation or turbidity in the droplet.

By the use of the present invention optimal crystallisation conditions for the generation of high quality crystals will be reached within a few hours or minutes, compared to months and years, also with much less amount, e.g. 10–100 fold less, of the desired molecule due to exceptionally small working volumes, e.g. in a picoliter range, as starting material. The benefit with small amounts of starting material and rapid means of screening crystallisation conditions is of particular importance when working with new and uncharacterised molecules, such as proteins. The means presented here realise a high throughput, which is desirable considering the enormous amount of different proteins and macromolecules that is revealed by projects like HUGO. We conclude that the combination of tools according to the present invention may open up entirely new time- and material saving approaches to life science research.

SHORT DESCRIPTION OF DRAWINGS

Figure 2:
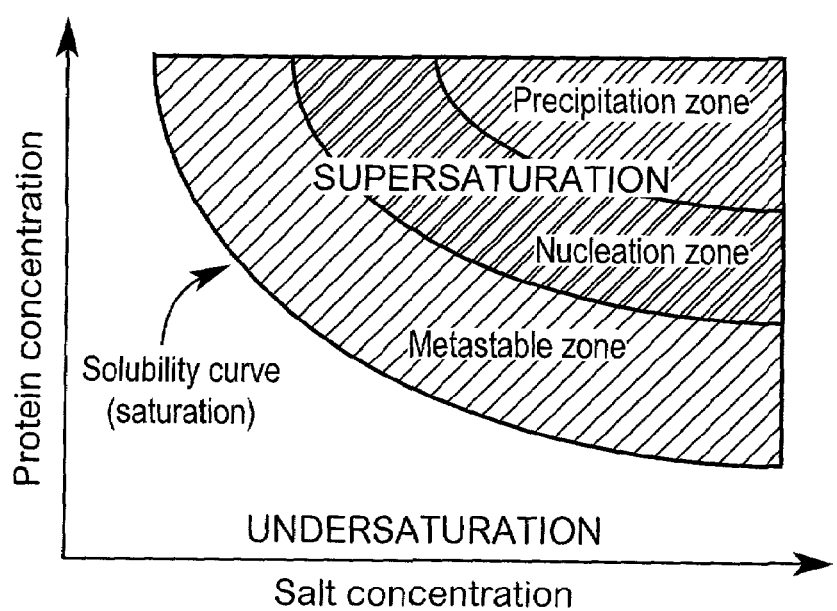
Figure 3:
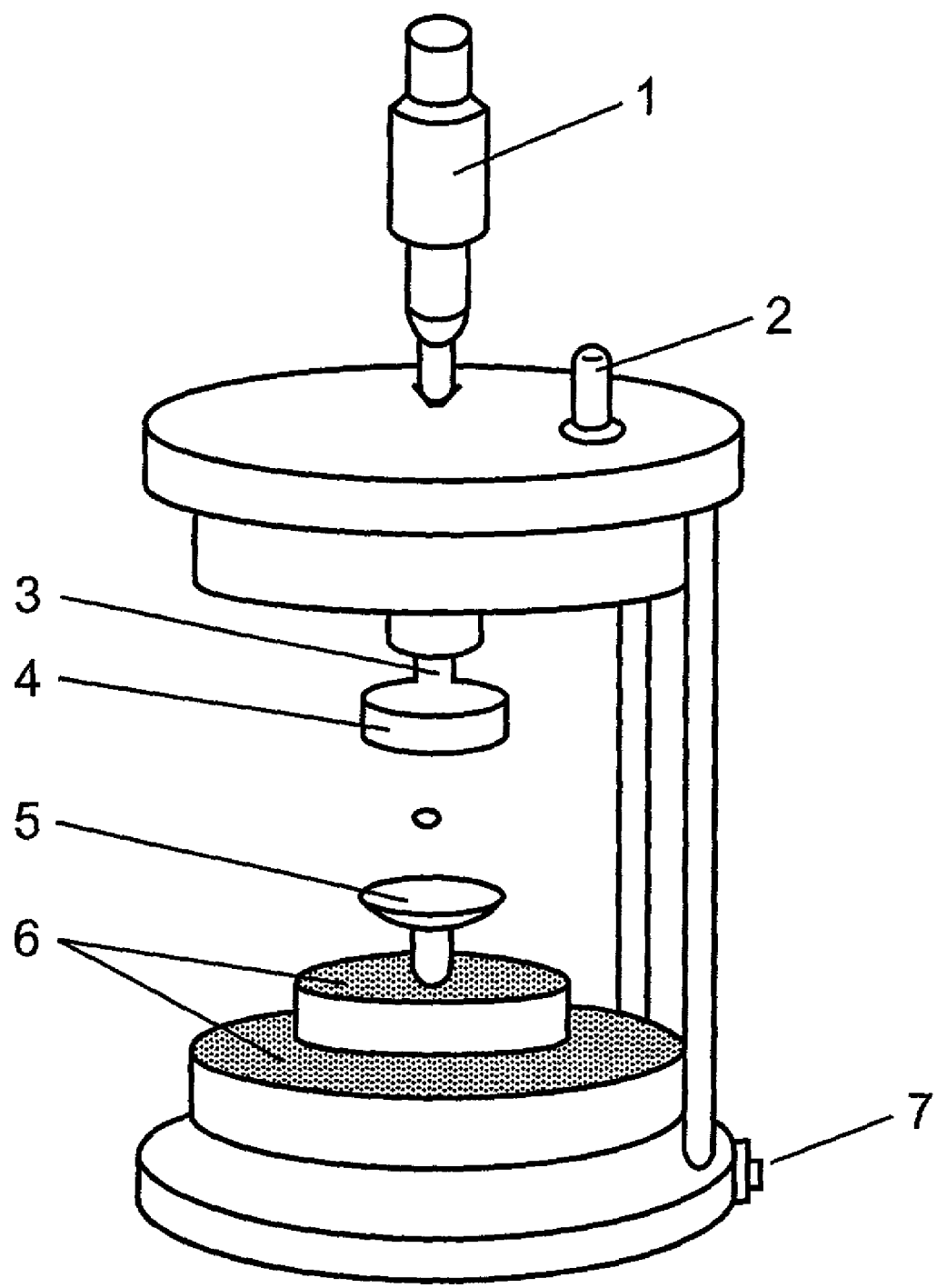
Figure 4:
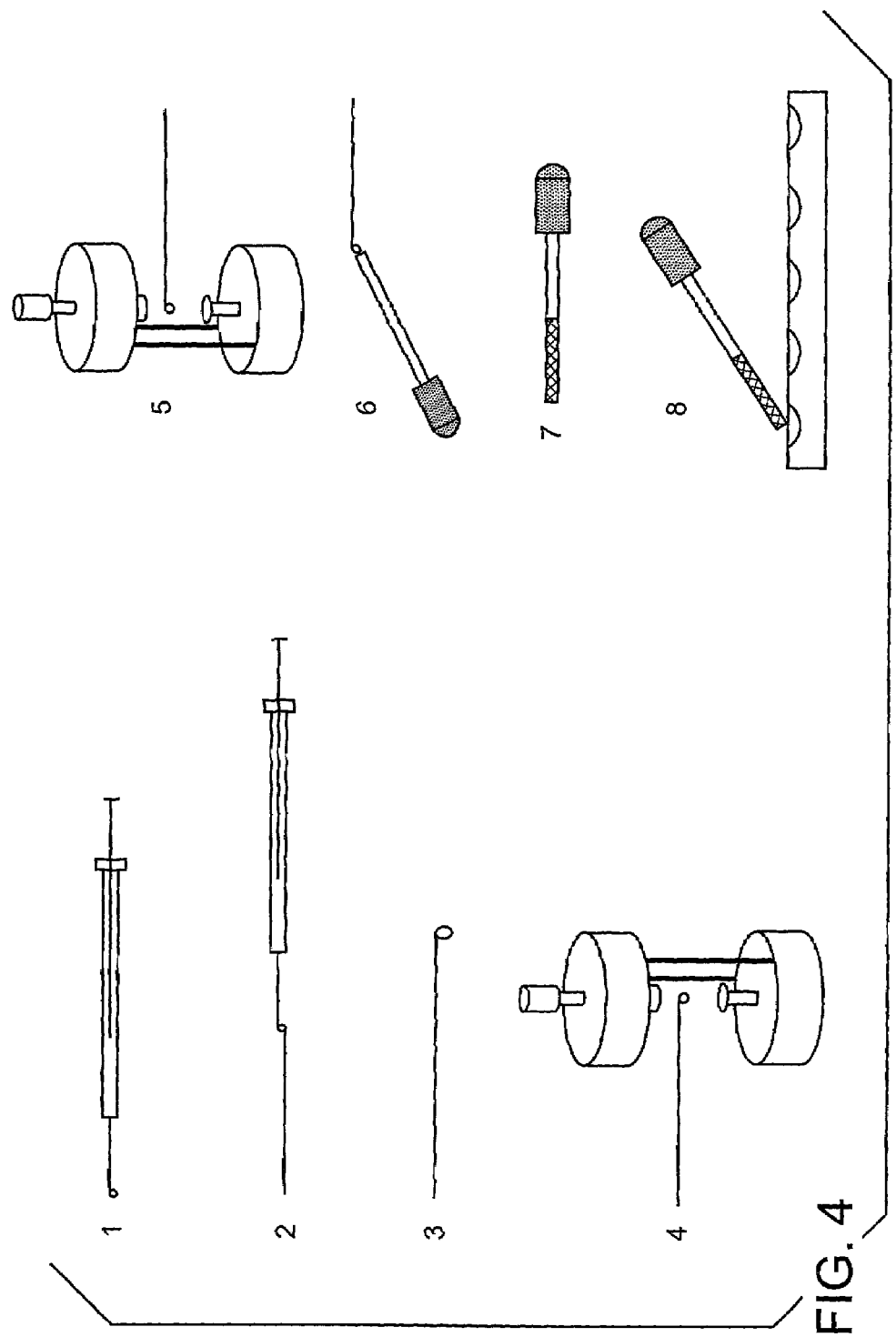
Figure 5A:
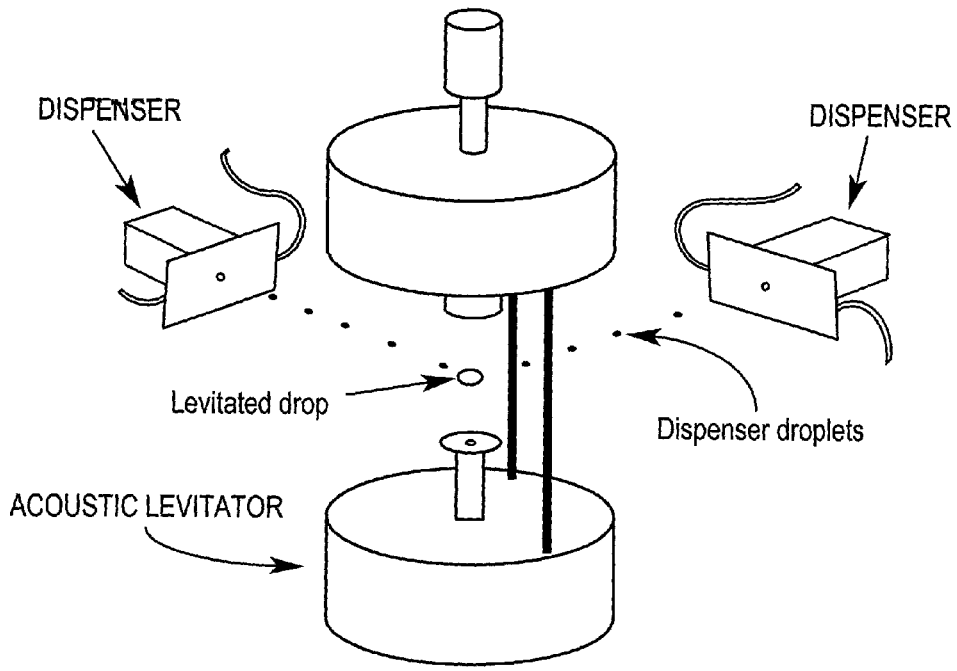
Figure 6:
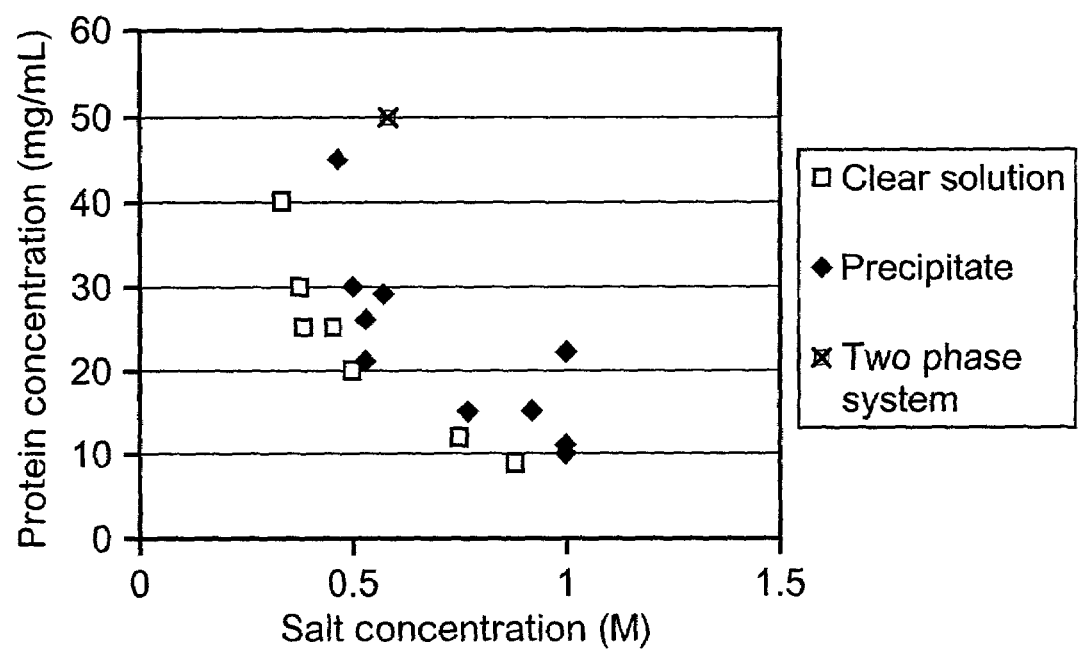
Figure 7A:
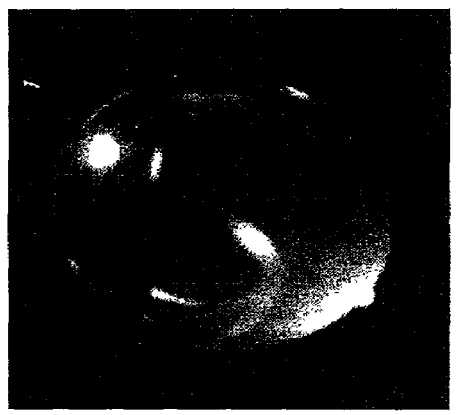
Figure 7B:
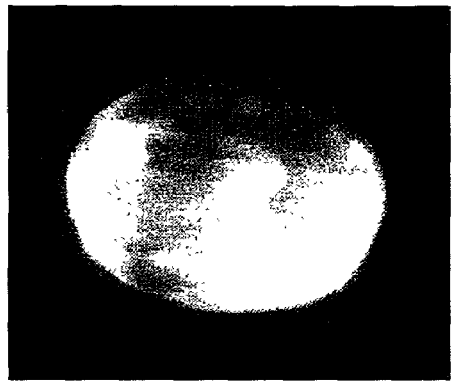
Figure 7C:
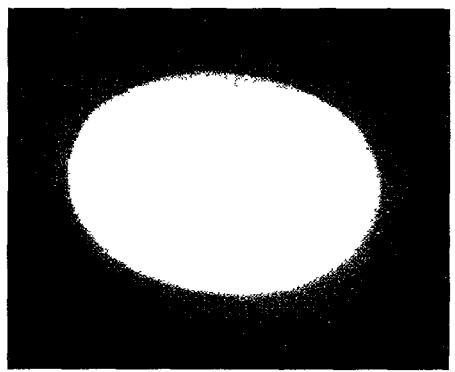
Figures 8A, 8B, 8C, 8D, 8E:
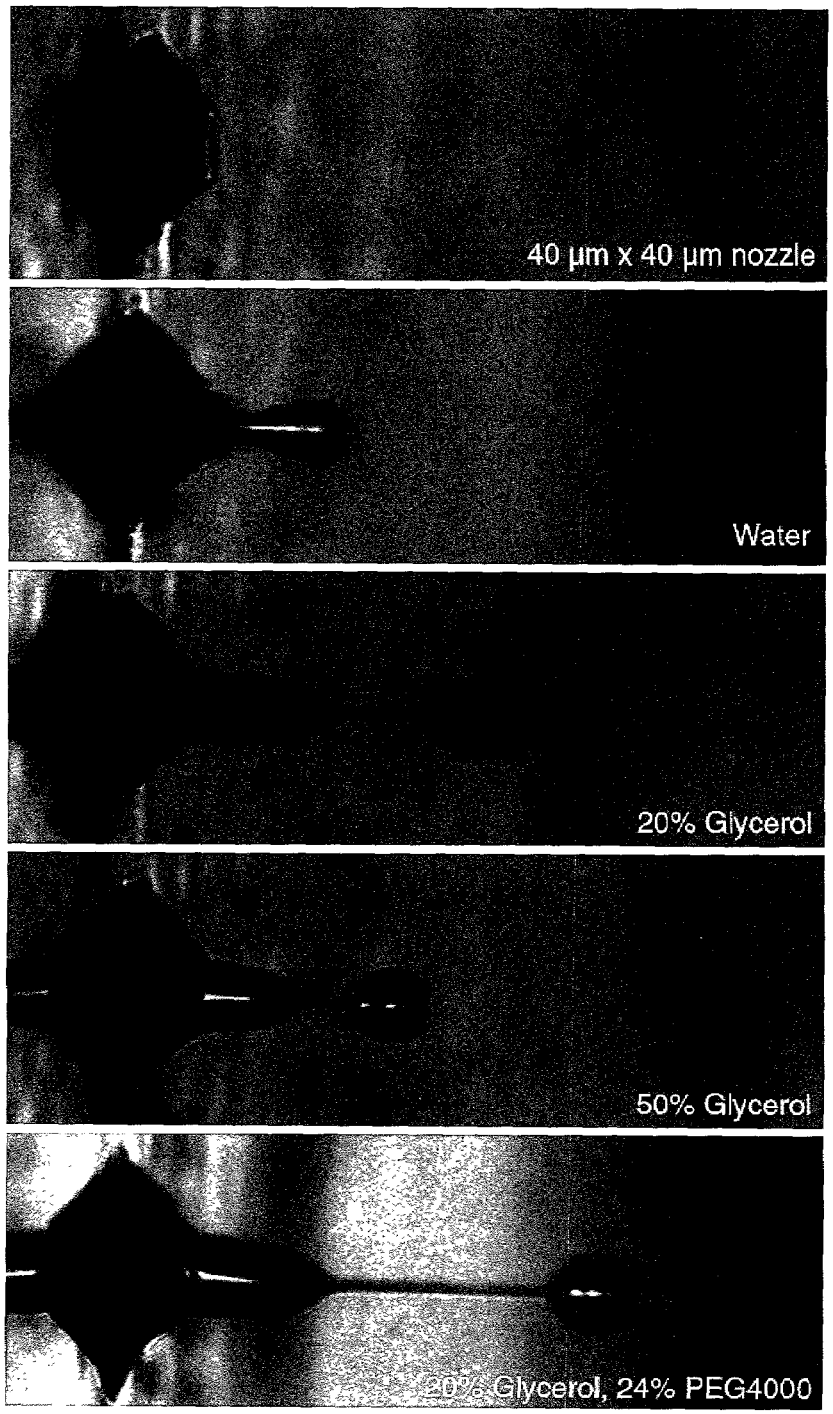
Figure 9:
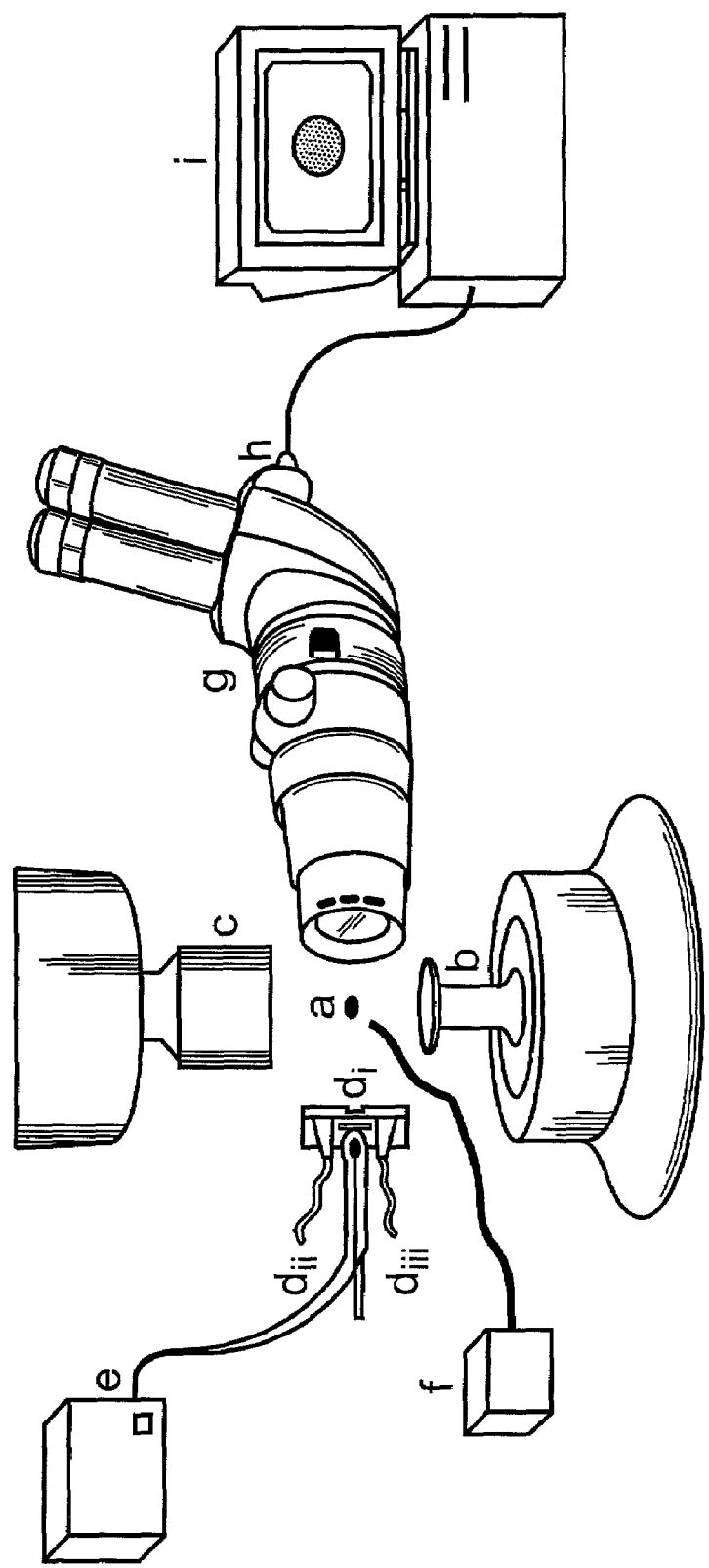
Figure 10:
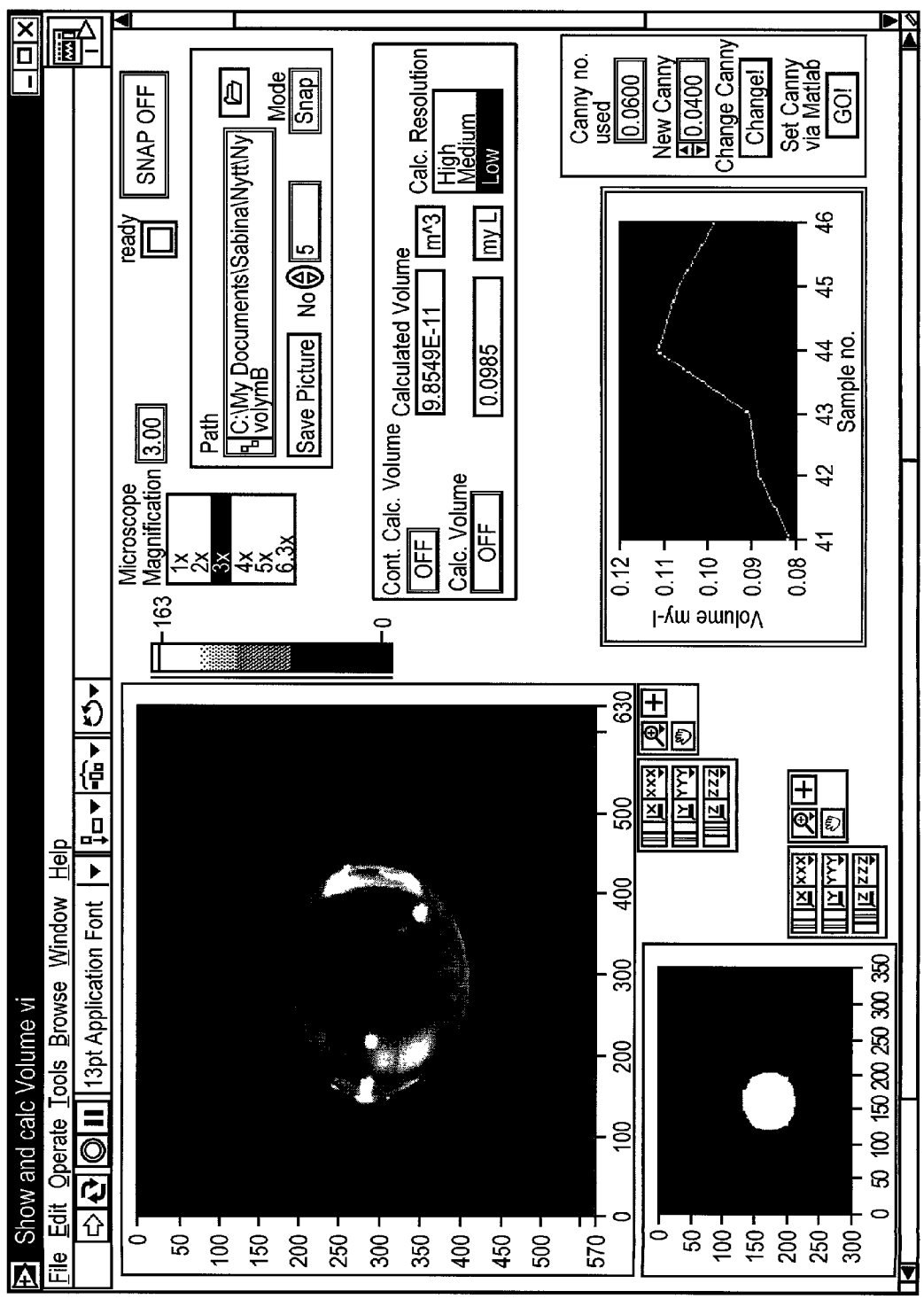
Figure 11A:
Figure 11B:
Figure 11C:
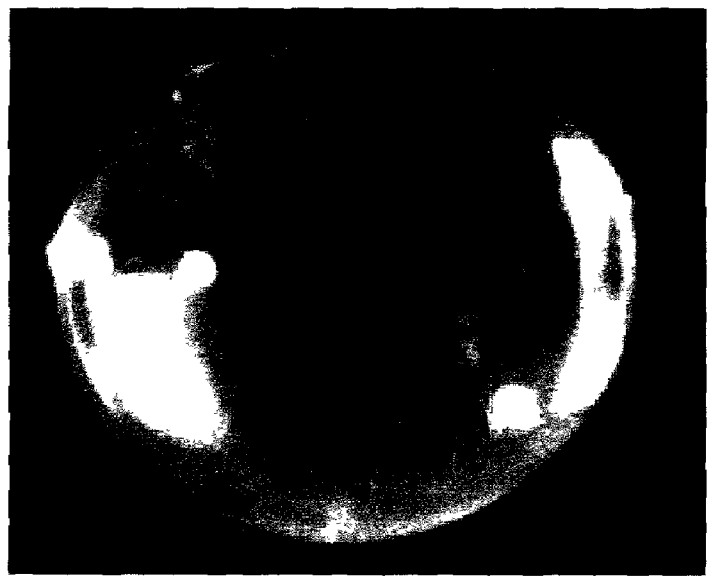
Figure 11D:
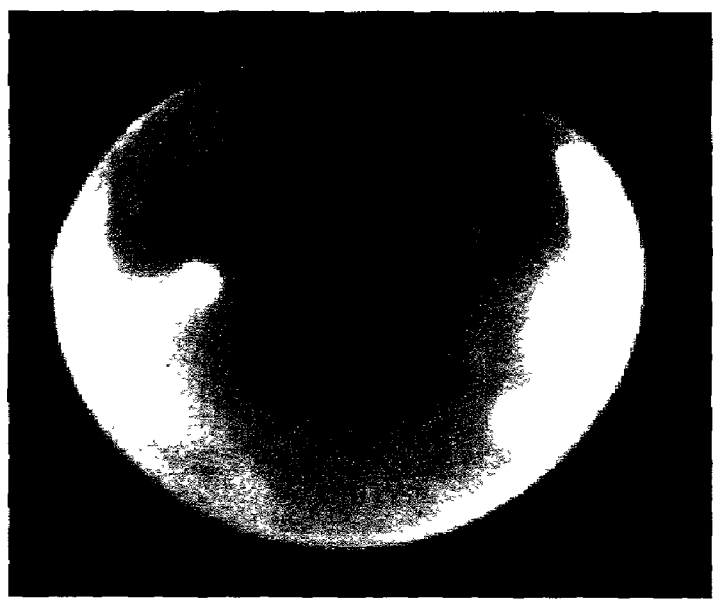
Figure 11E:
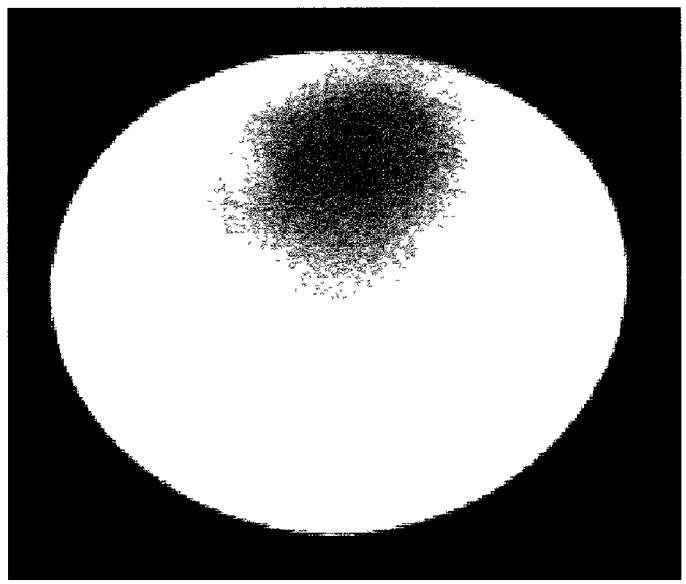
Figure 11F:
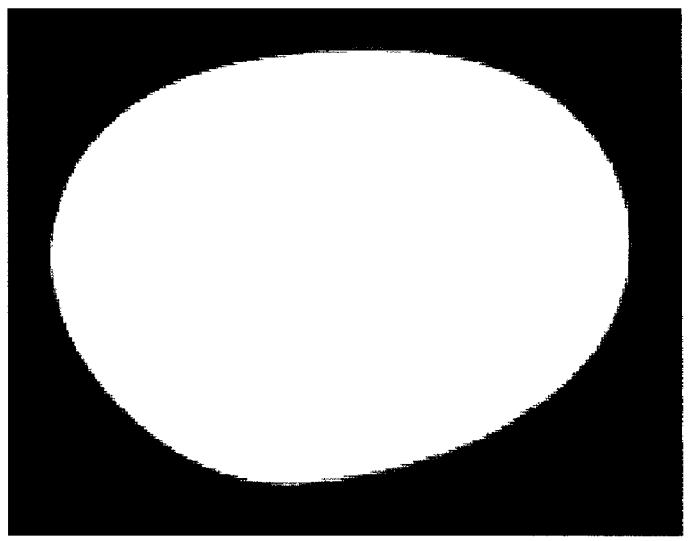
Figure 12A:
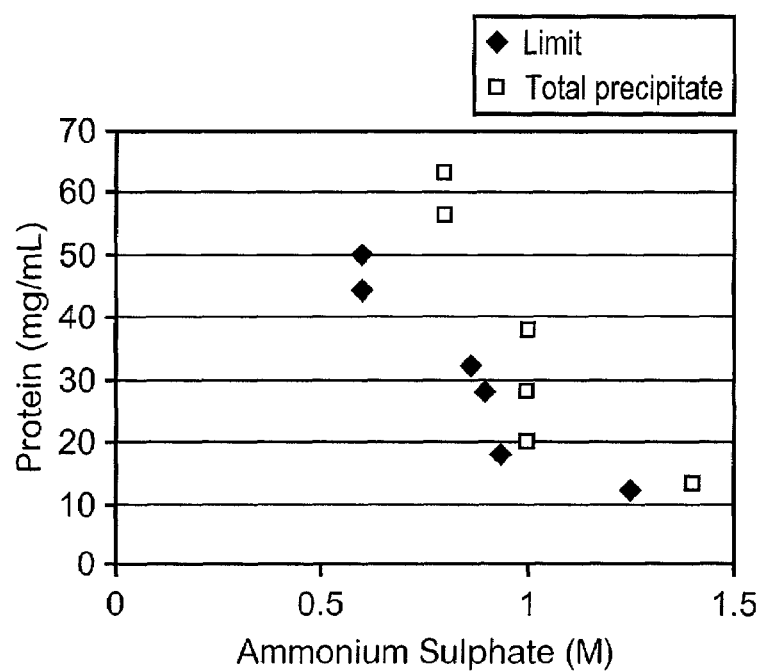

FIG. 1 shows a schematic representation of the critical nucleation size required for crystal growth, FIG. 2 shows an example of a simple two-dimensional phase diagram, FIG. 3 shows an example of the ultrasonic levitator shown without process chamber where 1 is a micrometer adjustment screw, 2 is a piezoelectric sensor connector, 3 is a Piezoelectric sensor, 4 is a reflector, 5 is a ultrasound transducer, 6 is an absorber, and 7 a HF-connector, FIG. 4 shows a manual method for drop handling, FIG. 5A shows an instrumental set-up for the screening of nucleation conditions using an acoustic levitator with two flow-through dispensers for the addition of a substance to the droplet, e.g. water and a precipitation agent and 5B the instrumental set-up unit for droplet volume surveillance and control using a black-and-white video camera coupled to the microscope, FIG. 6 shows a partial phase diagram of the protein fragment of titin, Z1/Z2, established with the levitation method. The x-axis shows the ammonium sulphate concentration and the y-axis the macromolecule concentration. Buffer system (imidazole/malate, 0.2 M) and pH 7 was used, FIG. 7 shows images of a levitated protein solution droplet during different stages in 7A, 7B and 7C of the experiment including the nucleation stage shown in FIG. 7B, FIG. 8 shows dispenser performance using water and glycerol. In 8A the nozzel is shown, in 7B water is shown, in 7C 20% glycerol is shown, in FIG. 7D 50% glycerol is shown and in 7E, 20% glycerol and 24% PEG4000 is shown, FIG. 9 shows the instrumental set-up for levitation screening of nucleation conditions of proteins. A levitated drop (a), trapped in the nodes of a standing wave created between the ultrasonic transducer (b) and the ultrasonic reflector (c) of an acoustic levitator. For additions to the levitated drop, a piezoelectric flow-through dispenser is used, featuring a picoliter droplet outlet ($d_i$), a flow-through channel inlet ($d_{ii}$) and outlet ($d_{iii}$). The dispenser is operated by a dispenser control unit (e) comprising voltage, pulse and function generators. For levitated drop surveillance, a microscope (g) equipped with a CCD camera (h) is used, combined with a cold light source (f) for drop illumination and a PC (i) for drop volume calculation and surveillance of drop turbidity, FIG. 10 shows a snap shot of the screen when using the volume calculation program created in LabVIEW™, FIG. 11 shows the image series of levitated D-serine-dehydratase drop during a screening experiment: a, initial protein drop; b, "limit", first signs of precipitation; c-e, precipitation; and f, total precipitate. The differences in drop shape and size are due to variations of the drop volume during additions and/or evaporation. The images were obtained using 6.3× magnification FIG. 12 shows in A) an example of precipitation graphs showing the precipitation tendency of D-serine-dehydratase at different concentrations when using ammonium sulphate as precipitant at pH 7.0. 12B shows precipitation graph obtained by the levitation screening method showing the precipitation tendency of D-serine-dehydratase with PEG 4000 at pH 7.0. These results were then used for choosing the conditions for optimisation experiments under oil. 12C shows combined precipitation graph showing the results from both the levitation screening and the optimisation experiments. It was established that single crystals were obtained using a protein concentration of 30 mg/mL and 20% PEG 4000, and FIG. 13 shows images of multiple crystals of D-serine-dehydratase obtained using crystallisation under oil and conditions established using the levitation screening method using ammonium sulfate at pH 7.0. The picture corresponds to 28 mg/ml of D-serine-dehydratase and 0.9 M ammoniumsulfate.

DETAILED DESCRIPTION

Definitions

The term "macromolecular crystallization", is intended to mean the crystallisation of e.g. proteins, peptides, such as oligo- or polypeptides, nucleic acid, such as DNA or RNA, and macromolecular assemblies. With "macromolecular assemblies", large molecules, a compound or complex are contemplated including polymers such as proteins, e.g. enzymes; polypeptides, oligopeptides, nucleic acids, carbohydrates, glycoproteins, membrane proteins, phospholipid polymers or a covalent or non-covalent complex of any of these.

The term "substance" is herein intended to mean a substance that can be added to a levitated drop, such as a salt, a polymer, an alcohol, water or a protein. The substance may influence the nucleation conditions, as is the case for precipitating agents, or be a molecule to be crystallised or screened for nucleation, e.g. a protein.

With the term "screen" it is intended to mean both detect, examine, test and/or score a large number of samples or a group of objects systematically, to separate them into groups or select one or more for a specific purpose in order to find those having specific desirable properties, e.g. nucleation tendency or optimal conditions for nucleation.

The term "nucleation" is intended to mean a kinetic process during which a crystalline core, the nucleus, forms, i.e. a change must be induced by e.g. evaporation, changing the relative concentration of a protein, precipitants or additives in the protein solution.

The term "nucleate" is intended to mean to form nuclei, i.e. three-dimensional. 3D, ordered aggregates., which forms by a given precipitant at different concentration regions.

The term "nucleation phase" is intended to mean the region in a phase diagram at which nucleation can occur.

The term "nucleation tendency" is intended to mean the tendency of a molecule to nucleate under given conditions. The protein must form 3D cores. nucleus or microcrystals, i.e. small crystals with poor quality for x-ray experiments, which demonstrates the ability of a solute to separate as a solid phase from under the used conditions. After the nucleus has formed, the nucleus may either dissolve, form a crystal or an amorphous precipitate.

With "nucleation conditions" it is intended to mean conditions or parameters affecting the nucleation tendency, precipitation tendency and/or the nucleation phase. Examples of such parameters and conditions are listed in table 1.

The term "levitator" is intended to mean a device that generates a force that overcomes the gravitational forces on a drop. For acoustic levitation, this is achieved by generating a standing wave with exactly spaced nodes and antinodes by multiple reflection between a radiator and a solid reflector for levitating e.g. a droplet. Levitation can be obtained using ultrasound, laser light, air flow, electric or magnetic fields. An "ultrasonic" or "acoustic" levitator is herein intended to mean a device that generates a standing wave using an ultrasonic radiator and a solid reflector. Electrostatic levitation is achieved using electric fields, magnetic levitation using magnetic fields. Hybrid acoustic/electrostatic levitation means that the levitation device is capable of using both, or either, ultrasound and electric fields to levitate a sample.

The term "levitated drop" or "levitated droplet" is a fluid or gas drop positioned so that gravitational forces on the drops are overcome by the means of other forces.

"Microgravity environment" is herein intended to mean an environment with very low gravity (μg). A true microgravity environment is space. Levitation simulates microgravity, since gravity still exists but other forces overcome them.

The term "piezoelectric dispenser" is here intended to mean a flow-through piezoelectric droplet dispenser, mainly in the picoliter range.

The term "phase diagram" is intended to mean a diagram representing the basic relationship between the solution phase and the solid phase under given conditions. A diagram is based on experimental determination for a given molecule, e.g. a protein, under given physical conditions. It comprises a supersaturated region and an undersaturated region distinguished in the phase diagram. The boundary between the two regions constitutes a solubility line. To determine the solubility accurately, however, crystals must first be obtained. An example of a simple phase diagram is shown in FIG. 2. A "precipitation diagram" is a simplified version of a phase diagram, where one may retrieve some of the information one normally retrieve in a phase diagram, though, without the need for creating crystals.

The term "precipitating agent", or "precipitant", is intended to mean a substance that is used for precipitation of other substances form a fluid or gas.

"Solubility" is defined as the concentration of a macromolecule in solution in equilibrium with crystals of the same molecule.

The term "turbidity" is intended to mean cloudiness caused by sediment in suspension e.g. a cloudy condition in water due to suspended silt or organic matter. As used herein, the cloudiness, or turbidity, is due to precipitation of macromolecules from solution. The degree of precipitation is determined as degree of turbidity.

The term "nephelometry" is intended to mean a method of measuring turbidity in a water sample by passing light through the sample and measuring the amount of the light that is deflected. Visible light is passed through a fluid or gas and part of the incident radiant energy is dissipated by absorbtion, reflection and scattering while the reminder is transmitted. Measurements of the intensity of the scattered light, at different angles to the dispersed phase, are the basis of a nephelometric analysis.

The term "amorphous precipitation" is intended to mean a non-crystalline solid phase, that might aggregate, which consists of either partially unfolded macromolecules or totally unfolded, i.e. denatured, molecules. An amorphous, i.e. disordered, precipitation of a macromolecule, is opposite to ordered crystals.

Screening for Nucleation Using Levitation

The technique with levitated droplets is known. The present invention uses this technique for the screening of nucleation conditions of a molecule, such as macromolecules e.g a protein. With this technique, small volumes can be used and exactly controlled, the solute concentration of the droplet varied, and the droplet pH may be changed during experiments.

The present invention will retrieve information about the nucleation tendency of a molecule, such as a protein, by a given precipitant quickly and the optimisation procedure and crystallisation can thereafter start using standard methods.

Nucleation requires a higher degree of supersaturation than crystal growth. Interface or wall effects as well as shape and volume of drops can affect both nucleation and growth. Consequently, the geometry of the crystallisation chamber or drops has to be defined. Acoustic levitation of crystallisation samples might be comparable to containerless crystallisation in oil or gels, which has proved effective and useful. In the present invention, acoustic levitation is used for the screening of nucleation conditions of proteins.

Using the known levitation technique, the time and the material needed for a nucleation screening procedure, as well as the number of experimental set-ups, will decrease significantly using the invention. The technique will provide information about crystallisation conditions of a certain compound such as a macromolecule like proteins or nucleic acid.

One embodiment of the invention is a method for screening nucleation tendency of a molecule which comprises levitating at least one droplet of the fluid or gas in a levitator, delivering at least one substance to the levitated droplet with a dispenser for delivering a substance, detecting the nucleation tendency, and scoring the nucleation tendency. In a one embodiment, the nucleation tendency is detected with Raman spectroscopy, preferably in combination with a multi-angle light scattering to obtain a quantitative measurement of aggregate formation, turbidity or precipitate in the droplet. Though, the results may also be obtained with nephelometry, or as described in example 1 and 2 more manually with an illuminator source in combination with visual reading as outlined in FIG. 4, to obtain a quantitative measurement in the at least one droplet. The method according to the present invention uses an acoustic levitator with piezoelectric flow-through dispenser as described in detail below.

Knowledge of the concentration regions where nucleation occurs could be obtained faster using the present method than waiting for results from vapour diffusion or dialysis experiments.

In one embodiment of the present invention, the total results from screening is obtained after less than 1, 2, 3 weeks, the scoring of nucleation tendency after less than 30 minutes, 1, 2, 3, 5, 10 hours. When combined with optimised means of detection, e.g. Raman spectroscopy and multi-angle light scattering, the nucleation tendency may be detected already after 10 milliseconds–30 minutes. This is to be compared with months using prior art methods.

The optimised conditions to obtain high quality crystals for X-ray analysis where a larger scale crystallisation procedure is used, can thereby be chosen in such a way according to the present invention that more prerequisites may be included and more and larger forms of crystal high quality, e.g. x-ray quality, are obtained. The known technique using levitated droplets injected with one or more precipitants according to the invention could also offer a simplified way to determine the main features of the phase diagram. Larger experiments (with 10–15 µL droplet volumes) will then be required to determine the solubility over a gradient of protein concentration and for optimisation of the conditions, but the saving of time and material will still be considerable.

The nucleation phase is controlled in the present invention by injecting one or more precipitating agents such as a salt, a polymer such as PEG or glycerol, and/or an alcohol added into the levitated droplet using the flow-through picoliter dispensers in FIG. 5A influencing the nucleation conditions. FIG. 8 shows the dispenser performance during addition of water, 50% glycerol, or a mixture of PEG4000 and glycerol, in both cases using dispensers. In FIG. 8A the nozzel is shown, in 7B water is shown, in 7C 20% glycerol is shown, in FIG. 7D 50% glycerol is shown and in 7E, 20% glycerol and 24% PEG4000 is shown. The precipitant concentration needed to bring a solution to the unstable, supersaturated state may be determined by visual surveillance of the droplet turbidity, i.e. when the whitening of the droplet occurs upon precipitation, aggregate formation, precipitation or crystal formation. The precipitation zone of the phase diagram, as shown in FIG. 2, may then be established after reaching the uppermost limit of additives. Having this region of the phase diagram as the starting point the additions of the same or other precipitants or water, to prevent or balance evaporation, may be finely tuned so that the entrance into the nucleation zone is reached.

The tendency for nucleation may then be determined by the use of a black-and-white video camera coupled to the microscope with an cold light illuminator source or a low energy laser, e.g. below 650 nm, a as in FIG. 5B, nephelometry or as in the most preferred embodiment Raman spectroscopy which may be in a combination with a and multi-angle light scattering to obtain a quantitative measurement. Images obtained may be collected using a for the skilled man in the art traditional framegrabbing card and analysed using computer programs such as NIH Image® (http://rsb.info.nih.gov/nih-image/index.html), LabVIEW™, or MatLab™.

A System for Screening Levitated Droplets Using Ultrasonic Levitator

The present system according to the invention for screening nucleation conditions comprises at least one levitator for positioning at least one droplet, at least one dispenser for delivering at least one substance to the positioned droplet, and one or more means for detecting nucleation tendency in the at least one levitated droplet.

Any levitator known for the skilled man in the art may be used and the one mentioned should not limit the present invention. Examples of levitators to be used in the system and method according to the invention are acoustic, also called ultrasonic; electrostatic, air flow, magnetic levitators or any hybrids thereof. such as acoustic-electrostatic hybrid levitator. Suggestively, an acoustic levitator such as the APOS BA 10 from DANTEC/invent Measurement Technology GmbH, Erlangen, Germany, may be used for the levitation experiments. The ultrasonic levitator is a device that generates a standing wave with equally spaced nodes and antinodes by multiple reflections between an ultra-sonic radiator and a solid reflector (FIG. 3). Shown in FIG. 3 is a ultrasonic levitator without process chamber where 1 is a micrometer adjustment screw, 2 is a piezoelectric sensor connector, 3 is a piezoelectric sensor, 4 is a reflector, 5 is a ultrasound transducer, 6 is an absorber, and 7 is a HF, high frequency, connector.

One specific embodiment of the invention utilises the instrumental set up in FIG. 9. In FIG. 9, a levitated drop a, trapped in the nodes of a standing wave created between the ultrasonic transducer b and the ultrasonic reflector c of an acoustic levitator. For additions to the levitated drop, a piezoelectric flow-through dispenser is used, featuring a picoliter droplet outlet $d_i$, a flow-through channel inlet $d_{ii}$ and outlet $d_{iii}$. The dispenser is operated by a dispenser control unit e comprising voltage, pulse and function generators. For levitated drop surveillance, a microscope g equipped with a CCD camera h such as, but not limited to, Progressive Scan CV-M10RSC (Parameter AB, Stockholm, Sweden) is used, combined with a cold light source f for drop illumination and a PC i for drop volume calculation and surveillance of drop turbidity.

The levitator according to the invention may operate with a frequency of 1 kHz–100 MHz, such as 100–200 kHz, to be able to hold small objects like a liquid droplet with a volume of about 1 fl–100 µl, such as 250nl–1 µl, levitated in the nodal points of the standing ultrasonic wave. Since the levitated droplet is maintained in a fixed position at any time interval, the process under investigation is not disturbed by the influence of any other contacting surface than the surrounding medium, in this case air.

To position a droplet in the ultrasonic field, a needle, e.g, a 10 µl Hamilton syringe, may be used. Other options are regular dispensers known by the skilled man in the art, such as micropipets, nano-tips, hydropneumatic dispensers, "dead end shooter", e.t.c. In one embodiment, the flow-through piezoelectric dispenser described in detail in WO 99/44746 incorporated herein as a reference and further described below. The droplet of sample may be removed from the tip the needle by a capillary, such as the TSP 025 375 by Polymicro Technologies Inc., Phoenix, Ariz., USA or similar, after which the droplet is positioned in the ultrasonic field. The droplet is always positioned in the node directly above the middle of the levitator. The droplet size may differ, considering the application. The present invention has one embodiment with droplets of 50pl–3 µl, such as with an average size of 50pl–1 µl.

The system according to the invention also includes means of detecting the tendency for nucleation, which may be by the use of Raman spectroscopy in one embodiment in combination with a multi-angle light scattering as in the most preferred embodiment. Other embodiments use manual means such as micro capillary drop volume determinations, as outlined in FIG. 4 or by the use of a black-and-white video camera, e.g. a CCD (charge coupled device) camera, such as, but not limited to, Progressive Scan CV-M10RSC (Parameter AB, Stockholm, Sweden), coupled to a microscope with a cold light illuminator source a as in FIG. 5B, or nephelometry to obtain a quantitative measurement of aggregate formation in the at least one droplet.

One of the limits of precipitant addition to the protein solution has been the observation by visual surveillance of the droplet opalescence, or turbidity which is a primitive method of evaluating supersaturation. In one embodiment, Raman spectroscopy (Schwartz et al., J. Cryst. Growth 203:599 (1999)) and multi-angle light scattering to obtain a quantitative measurement of turbidity, precipitate or aggregate formation in the droplet is used. This may also be coupled to a microscope and a video-camera equipment for an easy and convenient, as well as recordable, surveillance when screening.

Figure 5B:
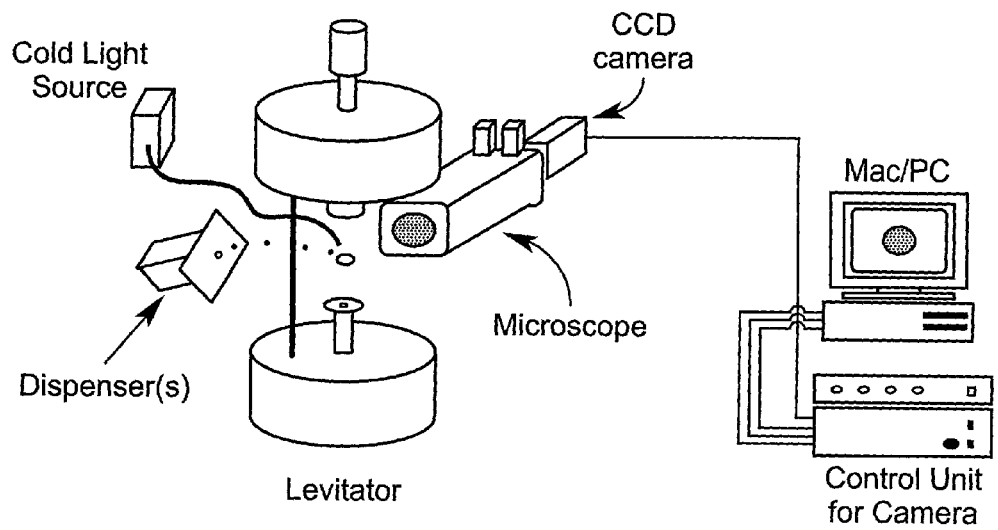

In still further embodiments, the system is controlled by a computer unit, where especially the camera is controlled via a control unit, such as shown in FIG. 5B. Programs suitable for controlling the camera and the system as well as analysing the droplet, such as the droplet size, are obvious for the skilled man in the art. Examples are, but not limited to, LabVIEW™ (National Instruments, Austin, Tex., USA) and MatLab™ (MathWorks Inc., Natlick, Mass., USA). By such a camera surveillance, coupled to automated calculatios of the droplet size, the concentration of e.g the protein levels are easily calculated and, e.g. plotted. Such handling will also speed up and ad to a lowering of the total time of screening for conditions for nucleation tendency. A picture of the volume calculation program, as used in one setup, is shown in FIG. 10.

The system may be arranged in an optimal way for detection of nucleation tendency in at least one levitated droplet, such as 2, 3, 4, 5, 6, 7, 8, 9, 10 or more droplets. This may be arranged e.g. for the illuminator source so that the at least one droplet is positioned around a central illuminator source in a way that each suspended droplet can be illuminated by rotating light. Of course, arrangement of several droplets allows for a parallel analysis, thereby lowering the total screening time for obtaining correct nucleation tendency conditions for a certain proteins and macromolecules.

The levitated drops are also useful for solubility studies, as further described in the experimental part.

The Flow-through Piezoelectric Dispenser

By the use of flow-through droplet dispensers, well-defined reagent volumes can be precisely injected into the levitated droplet. E.g. evaporation may be counterbalanced by continuous addition of water. The flow-through picoliter dispensers used in the preferred embodiment are developed in-house at the Department of Electrical Measurements, Lund Institute of Technology, Lund, using silicon micromachining methods. The device according to the invention is capable of ejecting droplets at a rate of up to 500 per second by pulsing a piezoelectric element. The actually ejected droplet volume depends on the size of the dispenser nozzle, the properties of the liquid and the pulse amplitude. The dispensers used for the levitation experiments may have nozzles of about 40×40 µm size and may be mounted on XYZ-micropositioning stages throughout the experiments in order to facilitate alignment as described in Petersson et al. (in *J. Chromatogr.* 714:39; 1998) or Nilsson et al. (in *Anal. Methods Instr. Special issue µ-TAS'96*, 96:88; 1996). In a one embodiment, the dispensers for precipitant addition may be set to eject droplets of e.g. 1 µl–3 µl from one drop to about –9000 Hz.

Another way of adding substances to the levitated droplet is done by Hamilton syringe with a capillary fused silica needle such as the 5A-SOC-100SA from Scientific Glass Engineering Inc., Austin, Tex., USA, a regular dispenser as the one described above or similar product obvious for the skilled man in the art.

The dispenser according to the present invention may ad at least one substance to the levitated drop, wherein the substance delivered to the droplet is a substance influencing the nucleation conditions, e.g. a salt, a polymer such as PEG (polyethylene glycol), glycerol, water and other solvents, e.g. an organic solvent such as alcohol. It may also deliver the molecule to be screened, like a macromolecule such as a protein, a membrane protein, a peptide, such as an oligopeptide or polypeptide, an enzyme, a receptor, a drug compound, nucleic acid, such as DNA or RNA, oligonucleotide, polynucleotide, or complexes or assemblies thereof. Complexes and assemblies may also include ligands, which may be one or more natural ligands, metals, or salts, or a drug compound.

Use of the System and Method.

The above-described system and method according to the present invention may be used for screening of nucleation tendency or for screening crystallisation conditions or amorphous stage conditions for any molecule, such as a macromolecule, e.g. crystallisation conditions or amorphous stage conditions for a molecule such as a protein, a membrane protein, a peptide, such as an oligopeptide or a polypeptide, an enzyme, a receptor, a drug compound, nucleic acid, such as DNA or RNA; oligonucleotide, polynucleotide, a macromolecule, macromolecular assembly or complexes.

The amorphous stage is characterised by an amorphous precipitation. An amorphous precipitation, as well as a crystal, of the molecule, such as the macromolecules described above, may be used for a rational drug design in the pharmaceutical industry. Also, the amorphous stage for a specific molecule, may also be used in the actual drug formulation, composition or pharmaceutical composition.

Rational crystallisation work should be based on the experimental determination further underlying a phase diagram for a given protein under given physical conditions.

A phase diagram of a system is the quantitative description of those physical parameters required for a solid phase to form and be in equilibrium with the liquid phase. It gives direct information at which conditions amorphous precipitation appears, when nucleation of the solute occurs and in which region of a diagram crystals grow or never can form. The dependence of pH, temperature, and type of precipitating agent on the solubility of the compound is also determined. For similar reasons. It is also when crystallising proteins to construct phase diagrams but in the area of macromolecular crystallography this is seldom the practice. One of the reasons is that too large amounts of precious material, such as a protein, a membrane protein, a peptide, such as an oligopeptide or polypeptide, an enzyme, a receptor, a drug compound, nucleic acid, oligonucleotide, polynucleotide, or complexes or assemblies thereof, is needed.

A simple phase diagram is shown in FIG. 2. The standard procedure used by most skilled men in the art does not allow this, which further contributes to the random outcome of large experimental series. Phase diagrams offer one of the basic and most important pieces of knowledge necessary in order to grow protein crystals in a rational way. Phase diagrams can be determined most efficiently and most extensively when the crystallisation conditions of a particular protein are already known to at least some extent. Since this is not the case for an unknown protein, the use of levitation technique could prove advantageous in order to determine parts of the phase diagrams. A phase diagram of Z1/Z2 is suggested in Example 1 after screening for nucleation tendency using levitation according to the present invention.

A simplified version of a phase diagram is a precipitation diagram, where parts of the information retrieved in a phase diagram may be retrieved, though, without the need of complete crystal formation.

Droplet Handling

The system and method according to the invention is based on equipment for levitation, such as an ultrasonic levitation, to create contactless microenvironments. Specially designed flow-through dispensers realise delivery systems in the pico-liter, pl, scale. The small volumes needed and the absence of contacting surfaces make the levitation system highly useful for macromolecular crystallisation screening. A drop of protein solution is placed in the levitator, and precipitating agents injected with high precision into this volume using the dispensers. By utilising the evaporation of the drop as well as the possibility of varying the amount of additions, the composition of the levitated drop is easily varied with regard to protein, additive and precipitant concentration, allowing for a whole concentration range to be screened within a single experiment. The method is time-, labour- and material saving.

Microscope imaging is used to achieve constant control of the drop volume and give qualitative information of the aggregate formation in the drop.

In FIG. 4. a method for handling droplets manually when screening for nucleation tendency is outlined. This includes hanging a droplet from the needle of a syringe, e.g. a Hamilton syringe, 1, removal of a droplet from needle by a fused silica capillary 2, hanging a droplet from the fused silica capillary, positioning a droplet in the ultrasonic field 4, removal of drop from the ultrasonic field 5, positioning of a droplet on fused silica capillary to be drawn in by micro capillary 6, microscopical observations and volume determinations of a micro capillary filled with droplets 7, and emptying a micro capillary into a microtiter plate. The droplet handling may also be done by dispensers described above, or by the use of micropipets or nanopipets.

Optimising Protein Crystallisation Conditions Using Screening for Nucleation Tendency FIGS. 5A and B shows an instrumental set-up for screening of nucleation conditions using an acoustic levitator to hold a droplet of protein solution levitated. Two different flow-through dispensers are used for additions, one for the addition of precipitating agents and the other for the addition of water in dilution experiments.

One embodiment for the present invention is tested screening a protein using the levitation approach. Formate dehydrogenase (FDH), a genetically modified highly soluble protein from which crystals, good enough for diffraction studies, have never been obtained. The sample was kindly provided by Rob Meijers, EMBL, Hamburg, Germany. FDH is an NAD dependent enzyme, the structure of which has previously been solved as an NAD complex and site-directed mutagenesis was performed to turn it into an $NADP^+$-binding protein. FDH was used to check similar conditions with the levitation technique previously tried using other methods. Mutant FDH was tested both as an $NADP^+$ complex and unliganded, and in the presence and absence of glycerol. The levitation technique was used to screen a large number of precipitating solutions to search for ion dependence. A droplet of protein sample solution with a volume of maximum 1 μL was placed in the acoustic leviator.

The protein solution was kept in a 10 μL Hamilton syringe and a 1 μL droplet was taken out and transferred to the ultrasonic field. Precipitating agents were then injected into the levitated droplet using flow-through picoliter dispensers. Solution kits from Hampton Research, Laguna Niguel, Calif., USA were used. All reagents were sterile filtered prior to experiments.

The precipitant concentration needed to bring a solution to the unstable, supersaturated state was initially determined by visual surveillance of the droplet turbidity (the whitening of the droplet that occurs upon precipitation) within 0–60 minutes, such as 0–15, or already after about 30–120 seconds.

For mutant FDH, the starting point of experiments was the knowledge that ammonium sulphate is not possible to use as precipitating agent as for crystal production of the native protein. Furthermore, earlier experiments, using prior art techniques, implied that polymers are better precipitants than organic solvents. Therefore, the choice of precipitants was mainly restricted to PEG 4000 at neutral pH in imidazole buffer and using additions of varying types. The choice of additions was guided by earlier experience that ammonium acetate was essential for crystallisation. Cobolt ion addition was justified by its ability to ligate to histidine, since the mutant FDH carries a histidine tag.

Experiments using the levitated technique yielded the same results earlier obtained using other methods. It was found that 7.9 mg/mL mutant FDH in phosphate buffer (pH 7) gave crystals within one week when precipitated with 16% PEG 4000 in 0.02 M ammonium acetate (pH 6.5). Precipitation of 9.1 mg/mL protein with 16% PEG 4000 in $H_2O$ also yielded crystals, in this case within two days. Experiments performed with glycerol-containing protein samples (20% glycerol) gave no protein crystals, instead the precipitating agents crystallised.

For mutant FDH, glycerol has proved unsuitable to use because the precipitants used did not bring the solution to nucleation. Regardless of the type of precipitant used, nucleation does not occur in the presence of glycerol. In contrast, in the absence of glycerol, nucleation could occur and crystals were formed. The experiments also show that nucleation can occur both in the absence and presence of ammonium acetate. Cobolt ion addition did not give protein crystals under the tested conditions, instead pink spherulites, probably Co-crystals, were formed. Although the complex of co-factor and mutant FDH did not show nucleation tendencies, the results obtained can be used as a guideline at which conditions and concentration ranges new crystallisation experiments should be started. The experiments have provided clear indications of the conditions under which the complex precipitates or remains in solution.

These results were obtained within two weeks with the levitation technique using approximately 0.5 mg protein and visual surveillance of the droplet turbidity, e.g. the whitening of the droplet that occurs upon precipitation. The individual readings of turbidity was done within 15 minutes. This can be compared to experiments using standard methods where 100 mg protein has been used during a period of one year to yield the same results.

One of the limits of precipitant addition to the protein solution has been the observation by visual surveillance of the droplet opalescence, or turbidity, which is a primitive method of evaluating supersaturation. In a preferred embodiment, Raman spectroscopy (Schwartza et al, J. Cryst. Growth 203:599 (1999)) and multi-angle light scattering to obtain a quantitative measurement of turbidity, precipitate or aggregate formation in the droplet is used. This may also be coupled to a microscope and a video-camera equipment for an easy and convenient, as well as recordable, surveillance when screening.

Optionally, a computer, such as a PC, for controlling the system as well as for calculations of e.g. droplet size without removing the droplet from the levitator, may be used.

EXPERIMENTS

Material and Methods—General Description

Proteins Used

Equine infectious anaemia virus dUTPase (EIAV dUTPase), 20 mg/mL in 10 mM MOPS buffer pH 7.2 and 68 mg/mL in MOPS buffer pH 7.0, and *E. coli* dUTPase, 50 mg/mL in 10 mM MOPS buffer pH 7 (gifts from Dr. Rebecca Persson, Lund University, Lund, Sweden). Z1/Z2 domains of titin (gift from Martin Forster, EMBL, Outstation Hamburg, Germany), 60 mg/mL in $H_2O$ with 1 mM $NaN_3$. D-serine-dehydratase (D-SH) 60 mg/mL in $H_2O$ (Obmolova, G., Teplyakov, A., Harutyunyan, E., Wahler, G. & Schnackerz, K. D. Crystallization and preliminary X-ray Study of D-serine Dehydratase from *E. coli*. J. Mol. Biol. 214:641–642 (1990)).

Precipitation Solutions

Commercial kits (Crystal screen 1 (HR2-110) and Crystal Screen cryo (HR2-122)) from Hampton Research (Laguna Niguel, Calif., USA) used in standard vapour diffusion experiments for crystallisation of proteins were tested.

A second approach was to follow the "Stura footprinting solubility strategy" (Stura, E. A., Nemerow, G. R. & Wilson, I. A. Strategies in the crystallization of glycoproteins and protein complexes. *Journal of Crystal Growth* 122:273–285 (1992)) modified for our purposes according to Table 4 for the enzyme D-serine-dehydratase. The PEG solutions were prepared in 0.1 M imidazole malate buffer, mixed from 2M solution of imidazole and 2M solution of malic acid to give the desired pH and dilution to 0.1M. Ammonium sulphate solutions were prepared in 0.1M imidazole malate buffer over the pH range and adjusted when needed. Phosphate solutions were made from 4M $NaH_2PO_4$ and 4M $K_2HPO_4$ to pH 7.0. The pH was adjusted to 6.5 using phosphoric acid and to pH 8 using NaOH. Citrate solution was prepared in 0.01M sodium borate buffer. 2M sodium malonate at pH 7.2 and 0.1% $NaN_3$ was added to all solutions (McPherson, et al., A comparison of salts for the crystallization of macromolecules. *Protein Science* 10:418–422 (2001)).

TABLE 1

Choice of solutions for D-SH

| Precipitant | pH | | | |
|---|---|---|---|---|
| 42% PEG 400 | 5.5 | | | |
| 25% PEG 4000 | | 7.0 | | |
| 1.5 M Ammonium Sulphate | 5.5 | 7.0 | 8 | |
| 2 M Phosphate | | 6.5 | 7.0 | 8 |
| 1.5 M Citrate | | | | 8.5 |
| 2 M Malonate | | 7.0 | | |

Other precipitant solutions tested were 1.5M ammonium sulphate over the pH range 7.5–9.5 in 50 mM Tris/HCl buffer, 1.5M ammonium sulphate in 0.1M Tris/HCl buffer over the pH range 6.5–8.5, 1.5M ammonium sulphate in water for pH 5.5 and in 0.3M Tris/$H_2SO_4$ for pH 8.4, 22.5% MPD prepared from 70% MPD (Fluka microselect) in 0.1M Hepes, pH 7.5. and 30% (w/v) glycerol in 15 mM $MgCl_2$.

Polyethylene glycols (PEG 400 and PEG 4000) were from Hampton Research; imidazole from Fluka; malate from Sigma; $NaH_2PO_4$, $K_2HPO_4$, ammonium sulphate, sodium citrate, $MgCl_2$, and $NaN_3$ from Merck; Tris(hydroxymethyl)-aminomethane (Tris) and HEPES-Na-salt (N-(2-Hydroxyethyl)piperazine-N'-2-ethane sulfonic acid-Na-salt) from Serva Feinbiochemica. All chemicals were of the highest purity available.

Instrumental Set-up

The instrumental set-up is shown in FIG. 9. A drop of protein solution is trapped in a node of a standing wave in an ultrasonic levitator APOS BA 10 (DANTEC/invent Measurement Technology GmbH, Erlangen, Germany). The acoustic levitator operates with a frequency of 100 kHz and generates the standing wave with equally spaced nodes and antinodes by multiple reflections between an ultrasonic radiator and a solid reflector.

Flow-through droplet dispensers, developed in-house using silicon micromachining methods, are used for the additions of precipitation agents and water. The dispenser droplets are ejected from a flow-through channel formed by joining two microstructured silicon plates, 13 mm long, 6 mm wide and 250 μm thick each. The flow-through channel measures 8 mm×2 mm×50 μm and has a volume of 1 μl. In the centre of the channel, a protruding pyramid shaped nozzle is formed. A multilayer piezo-electric element is connected to the channel wall opposing the nozzle. By applying a short voltage pulse across the piezo-electric element it elongates and pushes into the channel generating a pressure pulse in the liquid. The increased pressure accelerates the liquid in the nozzle and a droplet is ejected. This process can be repeated at a rate up to several kHz. The volume of the ejected droplets is dependent on the size of the nozzle, the shape of the voltage pulse and liquid parameters like surface tension, viscosity and density. The dispenser and examples of applications are more extensively described elsewhere (Petersson M, Wahlund K G & Nilsson, S. Miniaturised on-line solid-phase extraction for enhancement of concentration sensitivity in capillary electrophoresis. *J. Chromatogr. A*, 841:249–261 (1999), (Onnerfjord, P., Nilsson, J., Wallman, L., Laurell, T. & MarkoVarga, G. Picoliter sample preparation in MALDI-TOF MS using a micromachined silicon flow-through dispenser. *Anal. Chem.* 70:4755–4760 (1998), (Laurell, T., Wallman, L. & Nilsson, J. Design and development of a silicon microfabricated flow-through dispenser for on-line picoliter sample handling. *Journal of Micromechanics and Microengineering* 9:369–376 (1999), (Santesson, S. et al. Airborne Cell Analysis. *Anal. Chem.* 72:3412–3418 (2000), (Gaspar, S. et al. A method for the design and study of enzyme microstructures formed by means of a flow-through microdispenser. *Analytical Chemistry* 73:4254–4261 (2001). The dispensers used for the levitation experiments had nozzles of 40×40 μm size and were mounted on XYZ-micropositioning stages throughout the experiments in order to facilitate alignment. During the levitation experiments, the dispenser for precipitation addition was set to continuously eject 65 picoliter droplets at a rate of 50 Hz. The additions were stopped when the drop volume was too large for levitation, or when visible turbidity was reached.

Surveillance of the Drop Turbidity

For surveillance of the drop turbidity, a microscope from Bergströms Instruments, Lund, Sweden, a cold light source from Schott, and a CCD camera and framegrabber from National Instruments were used. The drop volume was calculated during experiments using a computer program created in the LabVIEW™ environment as shown in FIG. 10.

Volume Determination

A computer program was created in the LabVIEW™ environment for drop volume calculation as shown in FIG. 10.

Levitation Screening Procedure

A drop of approximately 1 μl is levitated in the acoustic levitator. The drop can be positioned in the levitator either by using a Hamilton syringe of appropriate volume or by using the flow-through dispensers. The flow-through dispensers are further used for addition of precipitation agents or other substances and, for dissolving purposes, water, to the levitated drop. The drop is continuously monitored through a microscope by a CCD camera connected to a computer. Microscope imaging is used to achieve constant control of the drop volume and give qualitative information of the aggregate formation in the drop. The drop is visually surveyed for a change in turbidity, or light scattering properties, and the drop volume is continuously calculated to obtain the concentrations of protein and precipitants in the levitated drop at any time. An image series of a levitated protein drop during a levitation screening experiment is shown in FIG. 11. The drop volume and turbidity change during the experiment to reveal information about the precipitation behaviour of the drop constituents under given conditions. The relationship between protein and precipitant concentrations is displayed in precipitation diagrams as shown in FIGS. 12A and B. The diagrams are used during the levitation experiments to determine which concentrations are of interest in further experiments, but are primarily used after the screening experiments to select the proper degree of supersaturation expected to give microcrystals. Crystallisation experiments are set up in the batch mode and inspected.

Batch Crystallisation

In a batch crystallisation method, a macromolecule and one or more precipitation agents are mixed in various proportions and left to equilibrate in a closed chamber at constant temperature and pressure. Like for all the other two techniques a large number of parameters have to be explored before concentration conditions are found at which the macromolecule nucleates.

Optimisation Experiments

After the levitation screening and batch crystallisation tests, optimisation trials are needed to find the conditions for optimal, single crystal growth. Which kind of crystallisation technique is used in this stage is largely dependent on choice and preferences.

Verification of Micro-crystal Formation

From a precipitation diagram, as exemplified in FIG. 12, the upper and lower boundaries for the concentration of macromolecule and precipitant are given at which total precipitation of the macromolecule occur and a low degree of supersaturation has been reched, respectiely. Since a critical value for supersaturation is required for nucleation to occur an initial choice of conditions for crystallisation experiments is made between these two boundaries. A given volume of the macromolecule is mixed with an appropriate volume of precipitant to final concentrations corresponding to fixed, chosen values. Typically, 2–4 μl droplets are tested for minimum 2 points over the interval. The mixed solutions are placed in small containers and covered with paraffin oil and left to equilibrate.

Inspection of drops under a high magnification microscope easily reveals if microcrystals have appeared. The time-span for microcrystal formation can vary from minutes to days.

Example 1

Partial Phase Diagram Obtained After Screening for Nucleation Using Levitation

Background

The protein fragment Z1/Z2 constitutes two domains of the muscle protein titin. The sample was provided by Professor Matthias Willmanns, EMBL, Hamburg, Germany. The theoretical pI-value of the sample was 5.41 and the molecular weight 20689 Da. The sample concentration was ~60 mg/mL in $H_2O$ with a volume of 160 μL totally available. The conditions under which it previously had been crystallised were not known on beforehand. Experiments aimed at determining the boundary between the precipitating zone and the nucleation region in a phase diagram. Ammonium sulphate was constantly used as precipitating agent and the protein concentration ranged between 20–60 mg/mL at neutral pH.

Principle

Precipitating agents were injected into the levitated droplet using the flow-through picoliter, pl, dispensers (FIG. 5). The precipitant concentration needed to bring the solution to the unstable, supersaturated state was initially determined by visual surveillance of the droplet turbidity (the whitening of the droplet that occurs upon precipitation). The uppermost limit of additions was thereby reached immediately and the precipitation zone of the phase diagram was established. Having this region of the phase diagram as the starting point the additions of precipitants or water were then finely tuned so that the entrance into the nucleation zone was regulated.

Experimental Setup

A droplet of protein sample solution with a volume of maximum 1 μL was placed in the acoustic levitator. The protein solution was kept in a 10 μL Hamilton syringe and a 1 μL droplet was taken out and transferred to a fused silica capillary (TSP 025 375. Polymicro Technologies Inc., Phoenix. Ariz., USA) prior to positioning in the ultrasonic field (FIG. 4). The capillary was used so as to facilitate the detachment of droplet from needle.

Precipitation agents were added according to table 3.

Material

Ready-made solutions from kits (from Hampton Research, Laguna Niguel, Calif., USA) have been used. All reagents were sterile filtered prior to experiments, and some were diluted to meet the requirements of the dispensers.

Proteins used for crystallisation experiments were tested for purity by electrophoresis methods using standard SDS-PAGE.

Stereoscopic Zoom Microscope Nikon SMZ 800 Bergström Instrument AB, Lund, Sweden.

Analysis

After the levitation experiments, the droplet was removed from the ultrasonic field by the fused silica capillary and transferred into a 5 μL glass capillary (Drummond International Ltd, Cheshire, Great Britain) and placed under a microscope to establish the droplet volume (FIG. 4). The relationship between droplet volume and capillary length was determined earlier by a calibration procedure using droplets of different sizes and composition. The glass capillary was emptied into a well of a microtiter plate (FIG. 4) and the droplet was covered with paraffin oil so as to prevent evaporation of the droplet and consequent changes in droplet composition. The droplet was immediately observed under a microscope to check the presence of amorphous precipitate.

In order to evaluate the results, a scoring list according to Table 2 was used. The scoring list is based on visual surveillance of droplets. Normally, scoring lists are based on X-ray diffraction data, but that approach was not practically possible to use in this experiment.

Results were scored according to the scoring list presented in table 2 and the droplet concentrations were calculated. The reading of the plates was performed during one week of the experiments.

TABLE 2

Scoring list

| Score | Description |
| --- | --- |
| 0 | Clear solution |
| 1 | Solution + amorphous precipitate |
| 2 | Precipitate + micro crystals |
| 3 | Spherulites |
| 4 | Thin plate crystals |
| 5 | Rosettes + single crystals |
| 6 | Multiple crystals |
| 7 | Malign secondary nucleation |
| 8 | Well diffracting single crystals. 0 07 mm |
| 9 | Well diffracting single crystals, >0 15 mm |
| 10 | Separated single crystals with even dimensions and good diffraction ability |

Results and Discussion

Table 3 and FIG. 6 shows the results obtained with the levitation technique titin fragment Z1/Z2. The first droplet of the protein fragment Z1/Z2 in $H_2O$ to be tested showed that Z1/Z2 in water with a pH corresponding to pI precipitated quickly when 2M $(NH_4)_2SO_4$ in $H_2O$ (pH 5.5) was added. To reach turbidity, 0.6 M salt was needed. When using a protein concentration of 15 mg/mL, the results clearly show the concentrations needed to bring the solution through different zones in the phase diagram.

TABLE 3

Scored results for Z1/Z2 levitation experiments using various precipitating solutions and pH.

| Precipitation solution | pH | Protein conc. in drop (mg/mL) | Salt conc. in drop (M) | Score | Comments |
| --- | --- | --- | --- | --- | --- |
| 2 M $(NH_4)_2SO_4$ in $H_2O$ | 5.5 | 30 | 0.6 | 1 | Amorphous precipitate |
| | | 15 | 0.45 | 0 | No protein nucleation |
| | | | 0.6 | | |
| | | | 0.75 | 2 | Limit of nucleation zone |
| | | | 0.9 | 1 + 2 | Passage through nucleation zone |
| | | | 1.2 | 1 | Precipitation zone |
| 2 M $(NH_4)_2SO_4$ Tris/HCl | 8.5 | 30 | 0.15 | 0 | No protein nucleation |
| | | | 0.3 | | |
| | | | 0.45 | 2 | Nucleation zone reached |
| | | | 0.6 | | |
| | | | 0.65 | | |
| | | 20 | 0.6 | | |
| | | | 0.7 | | |
| | | | 0.8 | 1 | Amorphous precipitate |
| | | | 0.9 | | |
| | | 15 | 0.9 | 2 | Nucleation zone reached |
| | | | 1 | 1 | Amorphous precipitate |
| 2 M $(NH_4)_2SO_4$ TES/$SO_4$ | 7 | 50 | 0.58 | 1 | Information |
| | | 45 | 0.46 | 0 | used to create |
| | | 40 | 0.33 | | partial |
| | | 30 | 0.5 | 1 | phase diagram |
| | | | 0.37 | 0 | (FIG. 6) |
| | | 29 | 0.57 | 1 | |
| | | 26 | 0.53 | | |
| | | 25 | 0.45 | 0 | |
| | | | 0.38 | | |

TABLE 3-continued

Scored results for Z1/Z2 levitation experiments using various precipitating solutions and pH.

| Precipitation solution | pH | Protein conc. in drop (mg/mL) | Salt conc. in drop (M) | Score | Comments |
|---|---|---|---|---|---|
|  |  | 22 | 1 | 1 |  |
|  |  | 21 | 0.53 |  |  |
|  |  | 15 | 0.92 |  |  |
|  |  |  | 0.77 |  |  |
|  |  | 12 | 0.75 | 0 |  |
|  |  | 11.8 |  |  |  |
|  |  | 11 | 1 | 1 |  |
|  |  | 10 |  |  |  |
|  |  | 8.9 | 0.88 | 0 |  |
| 3 M phosphate | 7 | 15 | 0.4 | 0 | Liquid two-phase |
|  |  |  | 0.5 | 1 | Amorphous |
|  |  |  | 0.6 |  | precipitate |
|  |  |  | 0.8 |  |  |
| 1 M citrate | 8.5 | 30 | 0.9 | 1 | Amorphous |
|  |  |  | 1.2 |  | precipitate |
|  |  | 20 | 1.5 | 0 | No protein nucleation |
|  |  |  | 1.6 | 1 | Amorphous preciptate |
|  |  |  | 1.8 | 2 | Nucleation zone reached |

Observation under microscope also revealed that some droplets first showing an amorphous precipitate clarified after 5–15 minutes, thereby visualising the very soluble properties of this protein. From these data, recommendations on crystallisation conditions have been transferred to the EMBL team in Hamburg, Germany. It was later revealed that crystal formation was observed using lithium sulphate as the precipitating agent, which makes it likely that Z1/Z2 can also crystallise when precipitated with $(NH_4)_2SO_4$ as the levitation experiments show.

To be able to recommend optimised conditions it is useful to have data separating precipitation zone from solution. A partial phase diagram was established for the protein range 10–40 mg/mL (pH 7) and the results show distinguished zones (FIG. 6). The solubility line of the partial phase diagram was not possible to determine because the protein concentration over crystals could not be determined. The recommendation in this case is to work in the 20–40 mg/mL range, with a salt concentration of approximately 0.5 M.

Volume determination of droplet is essential since the concentrations of the levitated droplet must be calculated. The use of micro capillaries is a simple and cheap way to measure the drop volume. However, a tendency of the droplets to get caught at the tip of the capillary instead of being drawn into the capillary is known. The failure rate is about one in five. This happens more often when trying to draw the droplets into the capillary directly from the levitator. The best method seems to be to remove the drop from the levitator by a fused silica capillary and then letting the droplet be drawn into the micro capillary (see FIG. 4). Emptying the capillary into the microtiter plate causes another problem, since small air bubbles often form in the droplet. These bubbles disturb surveillance of the droplets and may also cause changes in the nucleation processes under study.

To improve the surveillance of supersaturation degree, a black-and-white video camera coupled to the microscope in combination with a cold light source for illumination of the droplet may be used as in example 2. This, in combination with appropriate computer programs, will simplify and speed up the data collection and the analysis. A computer programme for image analysis named NIH Image is suitable for this application. The programme is available free on the Internet (for further information and downloading instructions (see http://rsb.info.nih.gov/nihimage/index.html). The droplet turbidity is also easier to observe this way.

Example 2

Screening for Nucleation Tendency of E. coli dUTPase Using Video and Framegrabbing Background dUTPases are enzymes regulating the DNA synthesis and are used as targets for drug design. The enzymes have been crystallised earlier and their structures determined (Cedergren-Zeppezauer et al., Nature 355:740 (1992). Dauter et al., Acta Cryst., D54:735 (1998) and Dauter, et al., J. Mol. Biol., 285:655 (1999).

Principle

The E. coli dUTPase forms crystals readily at pH 4–5, but not at neutral pH or higher. Numerous attempts have failed using protein concentration between 5–10 mg/µl. The nucleation tendency was screened. The system equipped with microscope and video camera was tested using the enzyme E. coli dUTPase.

Experimental Set-up

The experimental set-up and apparatus is the same as outlined in example 1. Experiments with E. coli dUTPase was performed using the microscope volume evaluation approach as in example 1. Images of a levitated protein solution droplet during different stages of the experiment are shown in FIG. 7. The nucleation tendency of E. coli dUTPase was screened using video and framegrabbing.

Material

The protein sample was prepared according to experiment 1 and had a concentration 31 mg/mL in 0.1 M Hepes buffer, pH 7.5. As precipitant solution, 70% methyl pentane diol (MPD) in 0.1 M HEPES pH 7.5 was used.

Black-and-white CCD (charge coupled device) video camera (Progressive Scan CV-M10RSC, Parameter AB, Stockholm, Sweden) with progressive scan CCD sensor of ½" format, interline transfer type.

Image grabber IMAQ PCI-1408 (National Instruments, Sweden AB, Solna, Sweden).

Stereoscopic Zoom Microscope Nikon SMZ 800

Bergström Instrument AB, Lund, Sweden.

Analysis

MPD was added to the droplet in the concentration range of 0–30% and the light scattering properties of the droplet was evaluated for the entire concentration range.

Results were scored according to the scoring list presented in table 2.

Results and Discussion

Images of a levitated protein solution droplet during different stages of the experiment are shown in FIG. 7. In A, an image of the initial droplet placed in the levitator is shown. The droplet consists of 15 mg/mL E. coli dUTPase solution in 0.1 M Hepes, pH 7.5. The vibration-induced streaming in the droplet is clearly visible. In B, a two-phase system is starting to form in the droplet after addition of MPD to a droplet concentration of 20%. The droplet was placed in a microtiter plate under oil for crystal growth. A large crystal formed after 7 days, suggesting that the nucleation region was reached and identified during the levitation experiments. In C, the two-phase system is now completely developed after the addition of MPD to a droplet concentration of 30%. In a second, identical experiment, a droplet brought to this state was placed in a microtiter plate under oil for crystal growth. Microcrystals was formed after 2 days, suggesting that the nucleation region was reached and identified during experiments. Nucleation tendency for each condition is screened after 0–15 minutes, mostly within the first two minutes. Th essential finding in this experiment was that crystal form above 15 mg/μl.

These findings suggest that the system according to the present invention is useful for rapid establishment of the nucleation region of a protein. The great advantage compared to standard methods is the possibility to directly observe the passing of the protein droplet through different zones of the phase diagram (protein solution, two-phase system, precipitate etc). In contrast to standard methods, all necessary information about how the protein reacts with a certain precipitant at different concentrations can be obtained using a single droplet of 1 μL protein solution.

Example 3

Image Series of a Levitated D-serine-dehydratase Drop During a Screening Experiment.

Materials and methods, experimental setup is identical to the according to the general materials and methods description.

Results

Image series of a levitated D-serine-dehydratase drop during a screening experiment is shown in FIGS. 11a-f: a, initial protein drop; b, "limit", first signs of supersaturation; c-e, different stages of supersaturation; and f, total precipitation of protein. The differences in drop shape and size are due to variations of the drop volume during additions and/or evaporation. The images were recorded using 6.3× magnification. A picture was recorded every 30–60 seconds, and about 6 recordings were made. The total experimental time was 10 minutes.

Example 4

Precipitation Graphs of D-serine-dehydratase

Materials and methods, experimental setup and was performed according to the general material and methods description.

Verification and Batch Experiments

After the levitation screening, batch experiments were performed to establish whether protein nucleation and crystal growth did occur under the conditions selected from the precipitation graphs in FIG. 12 and if so, to what extent and of which quality.

Optimisation trials are needed to find the conditions for single crystal growth and were made by the group which delivered the samples These control experiments with D-serine-dehydratase were performed using crystallisation under oil and is shown in FIG. 13.

Results

Example of precipitation graphs showing the precipitation boundaries of D-serine-dehydratase at different concentrations when using ammonium sulphate as precipitant at pH 7.0 are shown in FIG. 12A. I fig The precipitation graphs obtained are used for the explicit purpose of screening, i.e. establishing a rough relationship of the nucleation tendency information later to be used in further batch experiments. Speed, ease of handling and low material consumption are favoured.

Figure 12B:
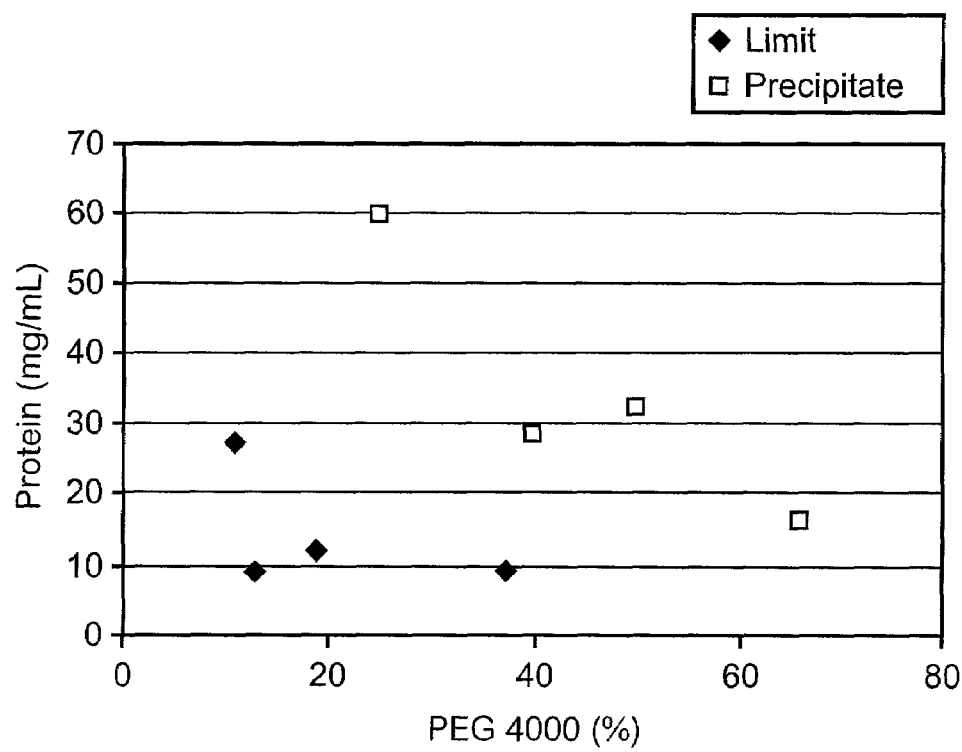
Figure 12C:
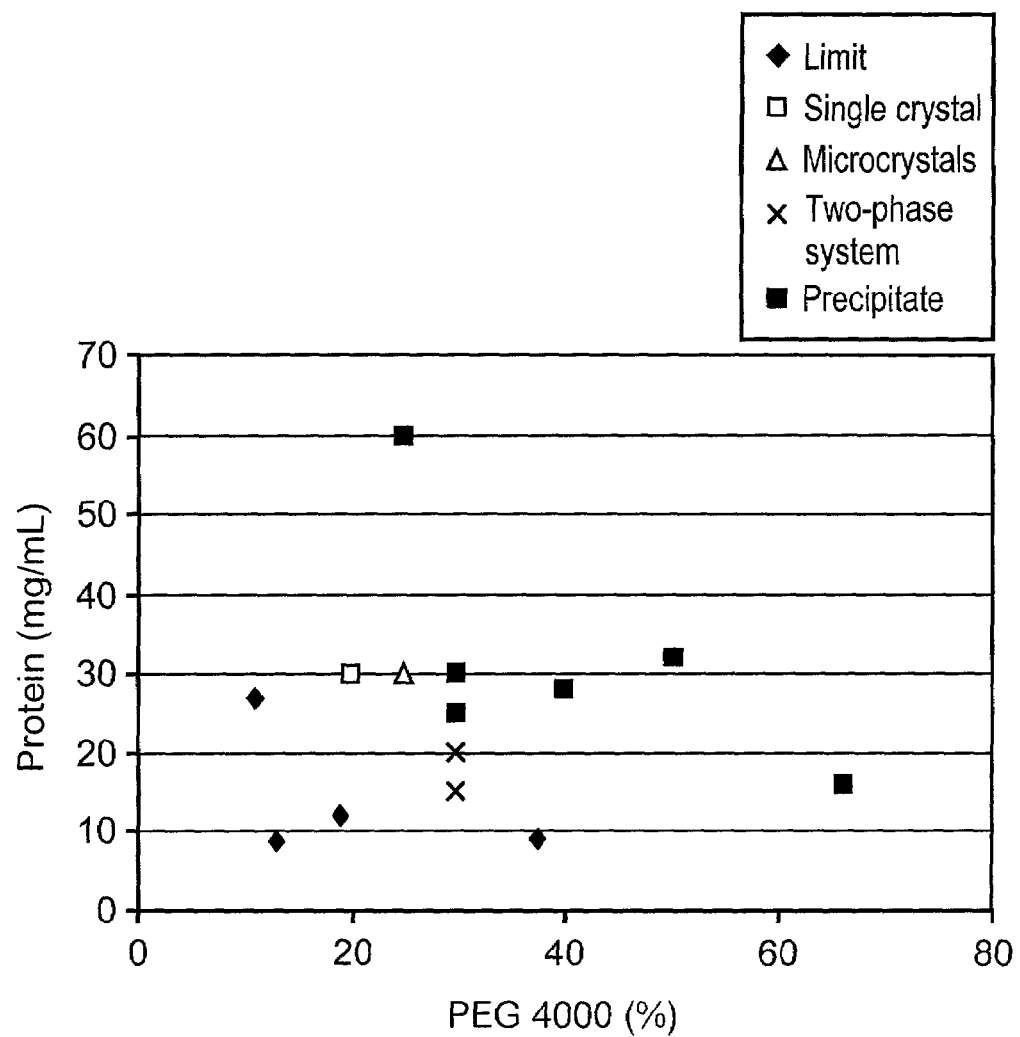
Figure 13:
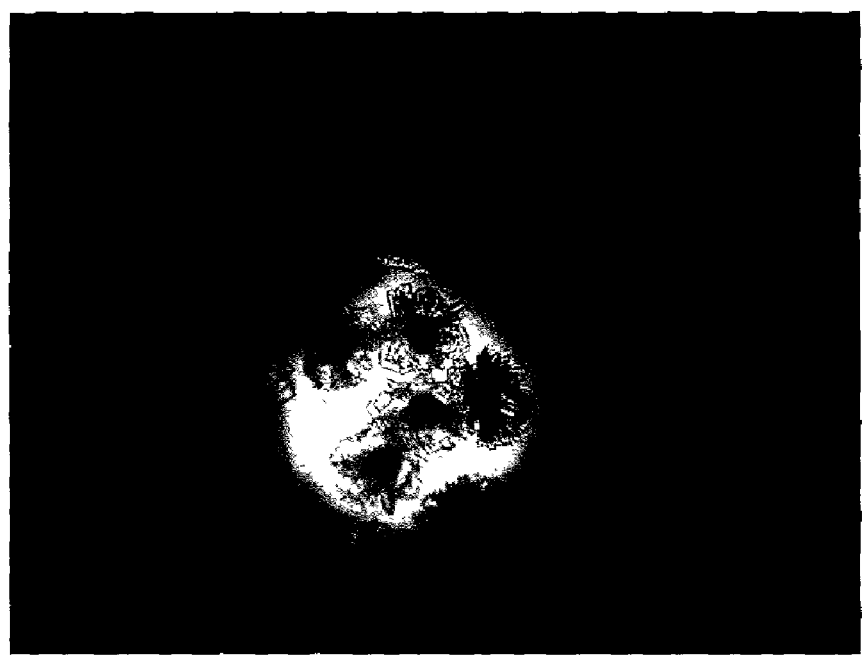

FIGS. 12B and C shows precipitation graphs obtained by the levitation screening method showing the precipitation tendency of D-serine-dehydratase with PEG 4000 at pH 7.0 in FIG. 12B. These results were then used for choosing the conditions for crystalisation experiments under oil. FIG. 12C shows the combined precipitation graph showing the results from both the levitation screening and the batch experiments. It was established that single crystals were obtained using a protein concentration of 30 mg/mL and 20% PEG 4000. A total protein amount of 504 μg was needed to find the right conditions and obtained single crystal, 84 μg for the levitation screening and 420 μg for the crystalisation experiments under oil.

The control and batch experiments with D-serine-dehydratase were performed using crystallisation under oil and are shown in FIG. 13. Drops of protein and precipitant were prepared as 4 μl volumes in 24-well plastic plates, each drop covered with 20–50 μL paraffin oil, and left to equilibrate. Images of crystals were obtained using crystallisation under oil and conditions established using the levitation screening method described above. In FIG. 13, the D-serine-dehydratase concentration is 28 mg/ml and ammoniumsulfate 0.9M at pH 7.0. Optimisation experiments are then performed to fine-tune crystal size and quality.

General Evaluation, Discussion and Conclusions

Evaluation of the Screening Method

By utilising the evaporation of the drop as well as the possibility of varying the amount of additions, the composition of the levitated drop is easily varied with regard to protein, additives and precipitant concentration, allowing for a whole concentration range to be screened within a single experiment. The method is time-, labour- and material saving.

Evaluation of Instruments, Dispensers and Levitator

The system is clearly useful for determining nucleation conditions. The levitator does not destroy the proteins, is capable of stable levitation, and precipitation can occur within the drop.

In the acoustic levetated drop, crystal nuclei can form but dissolves again (Ishikawa, Y. & Komada, S. Development of acoustic and electrostatic levitators for containerless protein crystallisation. *FUJITSU Sci. Tech. J* 29:330–338 (1993)). The use of an electrostatic (Rhim, W. & Chung, S. Containerless Protein Crystal-Growth Method. *J. Cryst. Growth* 110:293–301 (1991)) or electrostatic-acoustic hybrid levitator (Chung. S. K. & Trinh, E. H. Containerless protein crystal growth in rotating levitated drops. *J. Cryst Growth* 194:384–397 (1998)) would be equally useful in the screening method and thus give the added possibility of forming nuclei that not dissolve again and also crystals that persist.

The dispensers have shown useful for use with different precipitant solutions. The computer program is capable of calculating the drop volume with needed accuracy to give the concentrations of the constituents in the drop, information needed to construct the precipitation diagrams.

Evaluation of Precipitant Solutions and How They Were Chosen

Crystal screen 1 (HR2-110) is based on using a sparse matrix sampling technology for quick test of a wide range of pH, salts, and precipitants (Sparse matrix sampling: A screening method for crystallisation of proteins., Jancarik, J., Kim, S. H., Appl. Cryst. 24:409–411, 1991). In addition, Crystal Screen cryo (HR2-122) takes into account the handling procedure of crystals which includes flash freezing and therefore requires a cryo protectant, in this case various concentrations of glycerol (Garman, E. F. & Mitchell, E. P. *Journal of Applied Crystallography* 29, 584–586 (1996). A second approach was to follow the "Stura footprinting solubility strategy" (Stura, E. A., Nemerow, G. R. & Wilson, I. A. Strategies in the crystallization of glycoproteins and protein complexes. *Journal of Crystal Growth* 122:273–285 (1992)) modified for our purposes according to Table 4 for D-SH. For the other proteins, knowledge of the properties of the protein determined the actual choice of precipitants. HLADH (horse liver alcohol dehydrogenase) was used as model substance to test the instruments using 1.5M ammonium sulphate in 50mM Tris/HCl buffer as precipitant at room temperature over the pH range 7.5–9.5. For *E. coli* dUTPase, the precipitant solutions used were 22.5% MPD in 0.1M Hepes pH 7.5, and 30% (w/v) glycerol in 15 mM $MgCl_2$. For Z1/Z2, 1.5M ammonium sulphate (in water for pH 5.5 and in 0.3M Tris/$H_2SO_4$ for pH 8.4) was used as precipitant.

Generally for any protein when choosing precipitants, three categories are selected, salts, polymers and a viscous alcohol (2-methyl 2,4-pentanediol). Knowledge of the characteristics of the proteins will determine pH range and needed additives. The screening should be as simple as possible and it is preferred to have the protein dissolved in water—if possible.

Evaluation of Volume Determination/Turbidity Evaluation

The automated surveillance, via microscope and video connected to a computer with calculation programs for determining the drop size and further calculation of the concentration of an added substance, such as a protein or precipitation agent, simplifies the handling and reduces the total screening time for nucleation conditions. As well, since the droplet does not need to be removed from the levitator for size measurements, the system and method is, besides time saving also material saving, i.e. a highly economical method.

The invention claimed is:

1. A method for screening nucleation tendency or amorphous stage conditions comprising:
    (a) levitating at least one droplet of a fluid in an ultrasound acoustic levitator,
    (b) delivering at least one substance to said at least one levitating droplet with a dispenser for delivering said at least one substance,
    (c) detecting the nucleation tendency by multi-angle light scattering in combination with Raman spectroscopy to obtain a quantitative measurement of turbidity, precipitate, and/or aggregate formation in said at least one droplet, wherein said at least one levitating droplet is subjected to either droplet evaporation or addition of precipitants and utilization of vibration-induced streaming caused by ultrasound to further the turbidity, precipitate, and/or aggregate formation in said at least one levitating droplet, and
    (d) scoring the nucleation tendency.

2. The method according to claim 1, wherein said at least one levitatind droplet comprises a protein, a membrane protein, a peptide, an enzyme, a receptor, a drug compound, nucleic acid, a macromolecular, macromolecular assembly or complexes thereof.

3. The method according to claim 2, wherein the peptide is an oligopeptide or a polypeptide.

4. The method according to claim 2, wherein the nucleic acid is DNA or RNA, an oligonucleotide, or a polynucleotide.

* * * * *